United States Patent [19]
Kameyama et al.

[11] Patent Number: 5,045,493
[45] Date of Patent: Sep. 3, 1991

[54] SEMICONDUCTOR DEVICE AND METHOD OF MANUFACTURING THE SAME

[75] Inventors: Shuichi Kameyama, Itami; Kazuya Kikuchi, Hirakata; Hiroshi Shimomura, Moriguchi; Mizuki Segawa, Hirakata, all of Japan

[73] Assignee: Matsushita Electric Ind., Ltd., Osaka, Japan

[21] Appl. No.: 514,167

[22] Filed: Apr. 24, 1990

[30] Foreign Application Priority Data

Apr. 26, 1989 [JP] Japan .................................. 1-108609

[51] Int. Cl.⁵ .............................................. H01L 21/70
[52] U.S. Cl. ........................................ 437/59; 357/43; 148/DIG. 9
[58] Field of Search .................. 437/59; 148/DIG. 9; 357/43

[56] References Cited

U.S. PATENT DOCUMENTS

| | | | |
|---|---|---|---|
| 4,694,562 | 9/1987 | Iwasaki et al. | 357/43 |
| 4,727,046 | 2/1988 | Tuntasood et al. | 357/43 |
| 4,887,142 | 12/1989 | Bertotti et al. | 357/43 |
| 4,921,811 | 5/1990 | Watanabe et al. | 437/31 |
| 4,922,318 | 5/1990 | Thomas et al. | 357/43 |
| 4,927,776 | 5/1990 | Soejima | 437/59 |

FOREIGN PATENT DOCUMENTS

| | | |
|---|---|---|
| 0215583 | 3/1987 | European Pat. Off. . |
| 0281235 | 9/1988 | European Pat. Off. . |
| 0341821 | 11/1989 | European Pat. Off. . |
| 2208965 | 4/1989 | United Kingdom . |

OTHER PUBLICATIONS

Patent Abstracts of Japan, vol. 12, No. 234 (E-630) [3086] Jul. 7, 1988, JP-A-63031156, (NEC Corp.), 9.2.1988.

European Patent Office Search Report for E.P. 90 10 7859, dated 14-8-1990.

*Primary Examiner*—Olik Chaudhuri
*Assistant Examiner*—Long Pham
*Attorney, Agent, or Firm*—Ratner & Prestia

[57] ABSTRACT

A semiconductor device such as a Bi-CMOS having vertical or lateral bipolar transistors and MOS transistors is disclosed. The MOS transistors include a gate electrode made of a first conductive thin film, and sidewall spacers formed on the sides of the gate electrode and consisting of at least one deposition film. The vertical bipolar transistors include an emitter electrode made of a second conductive thin film, and an emitter diffusion window formed in the deposition film which is disposed under the emitter electrode. The lateral bipolar transistors include a base width defining region for defining the base width, and an insulation film formed between the base width defining region and the collector and emitter, and consisting of the deposition film.

10 Claims, 23 Drawing Sheets

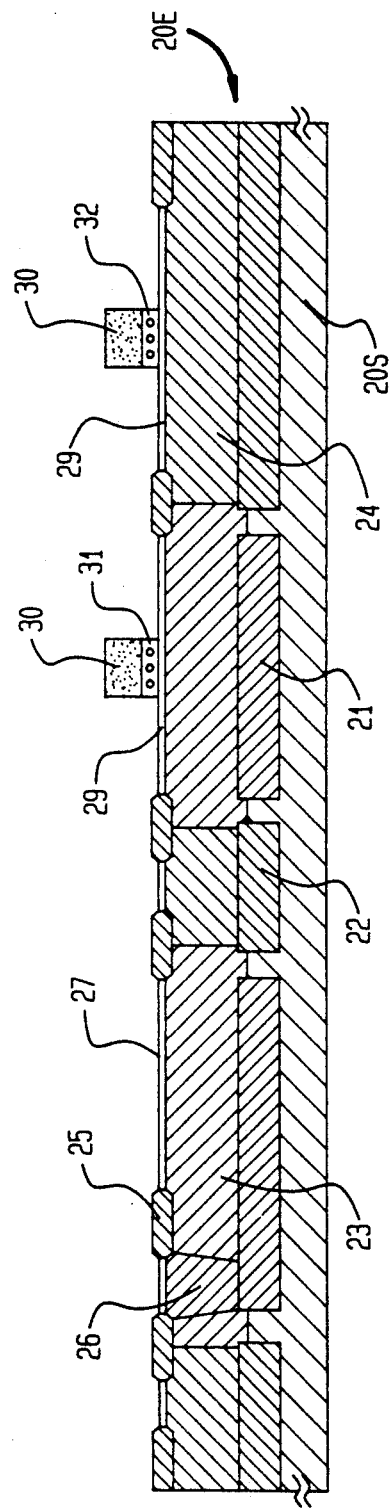
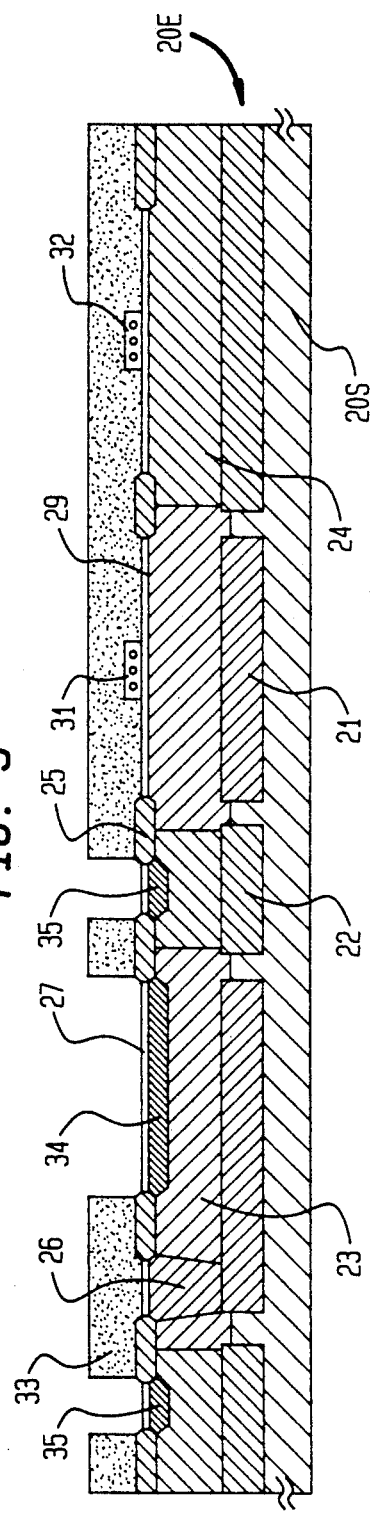
FIG. 4
FIG. 5

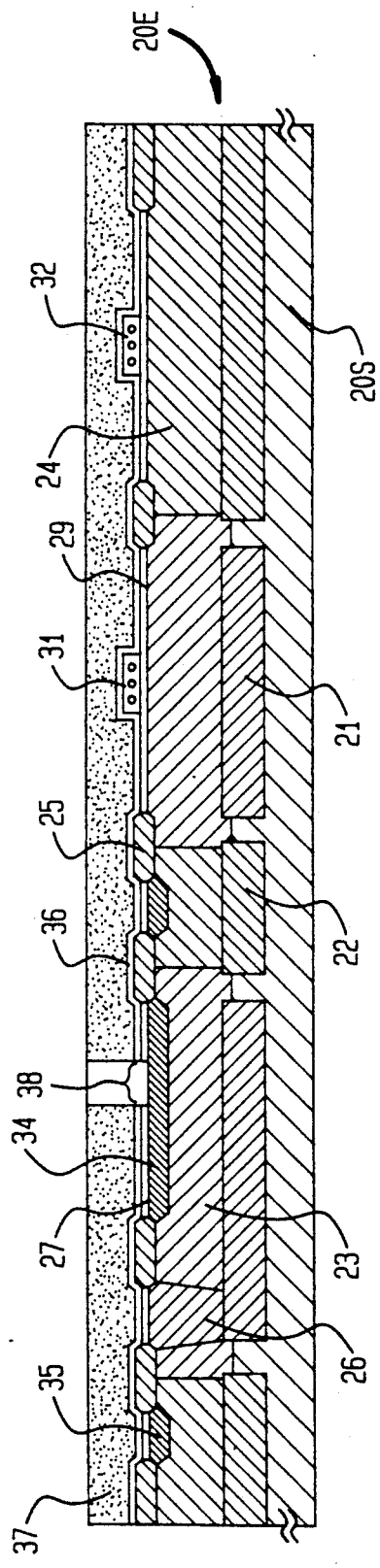
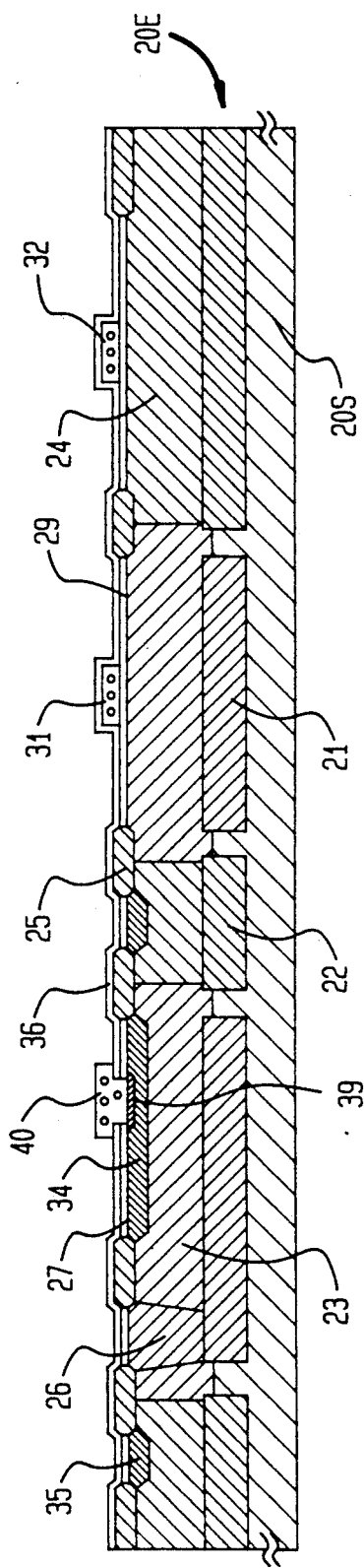
FIG. 6
FIG. 7

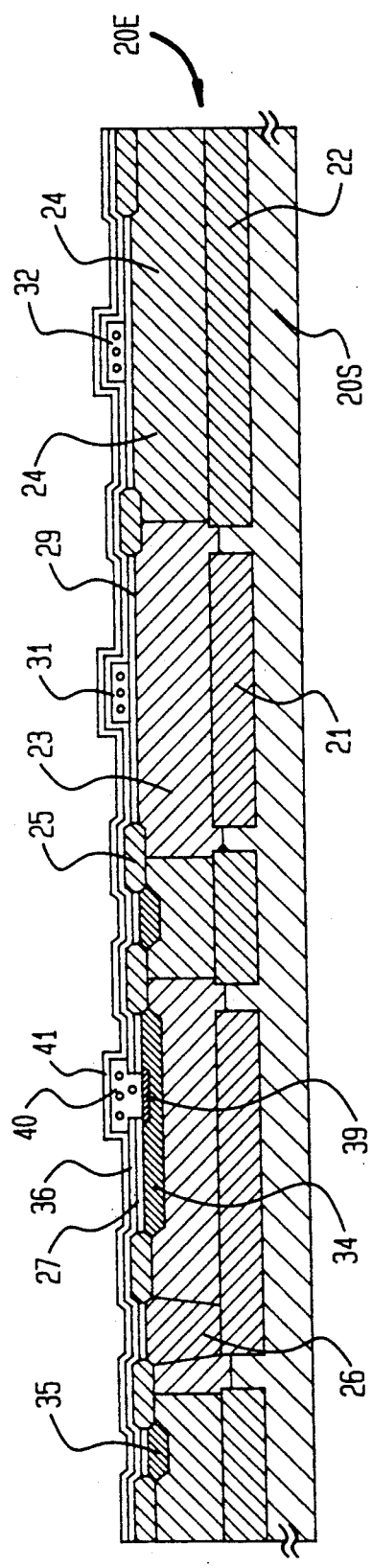
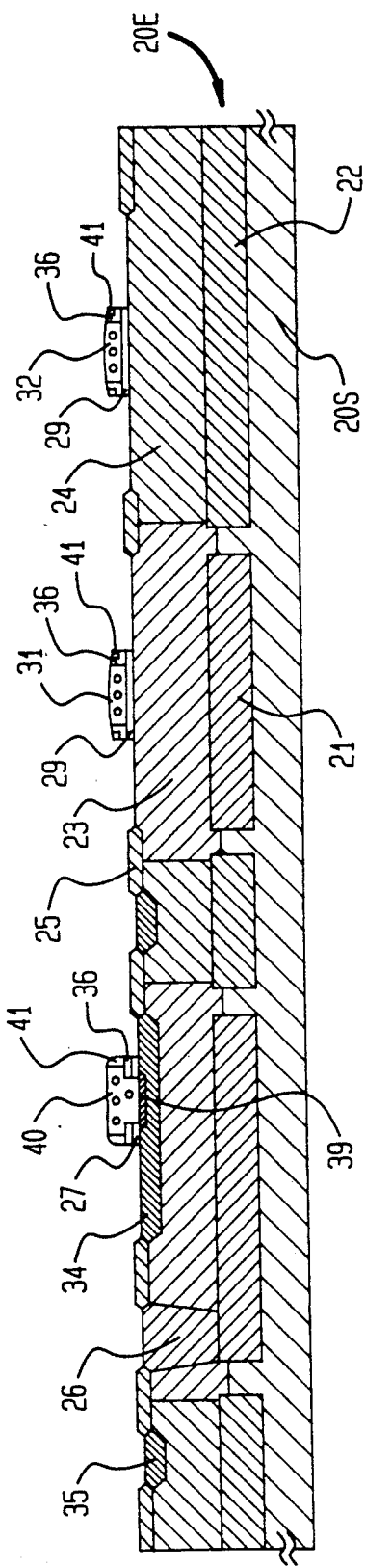
FIG. 8
FIG. 9

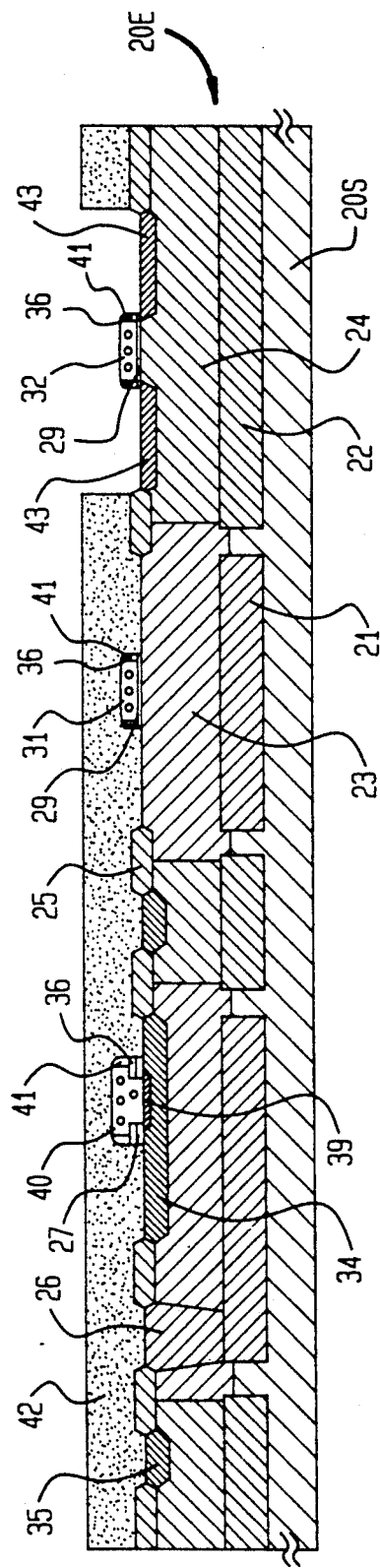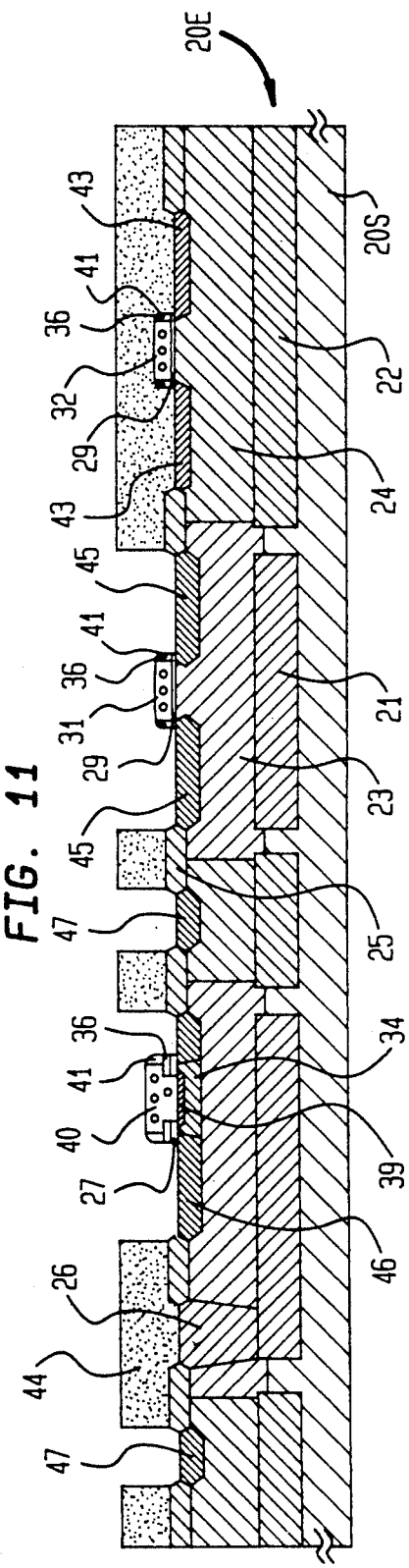

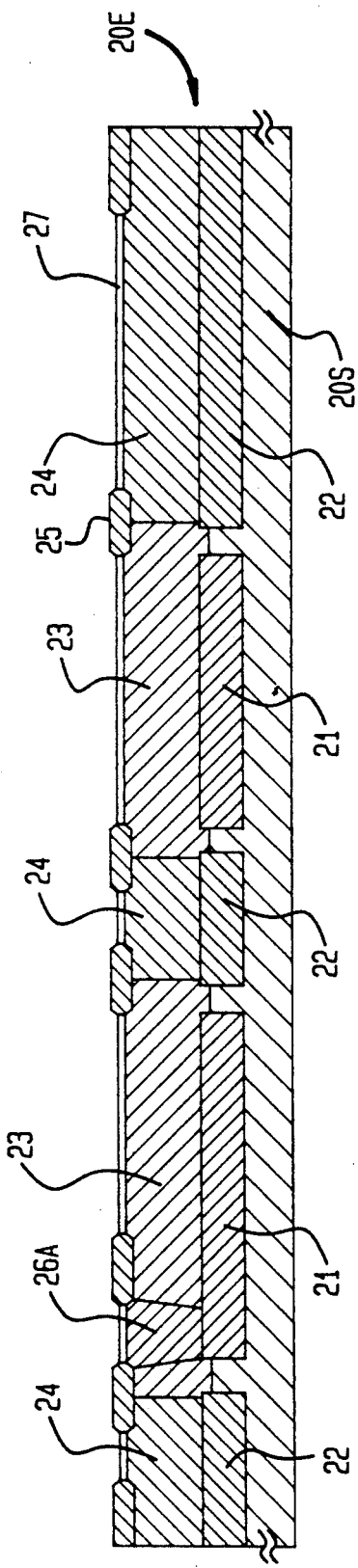
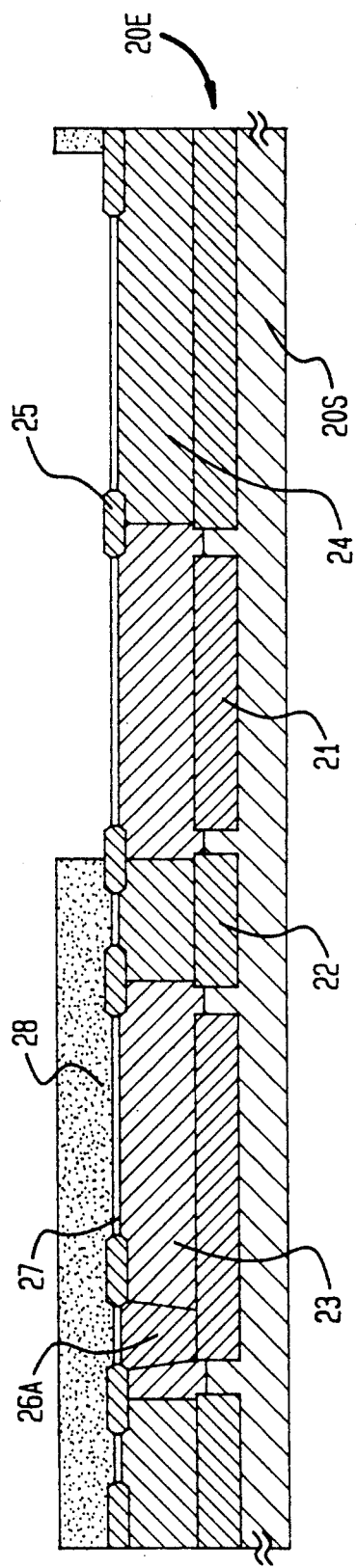

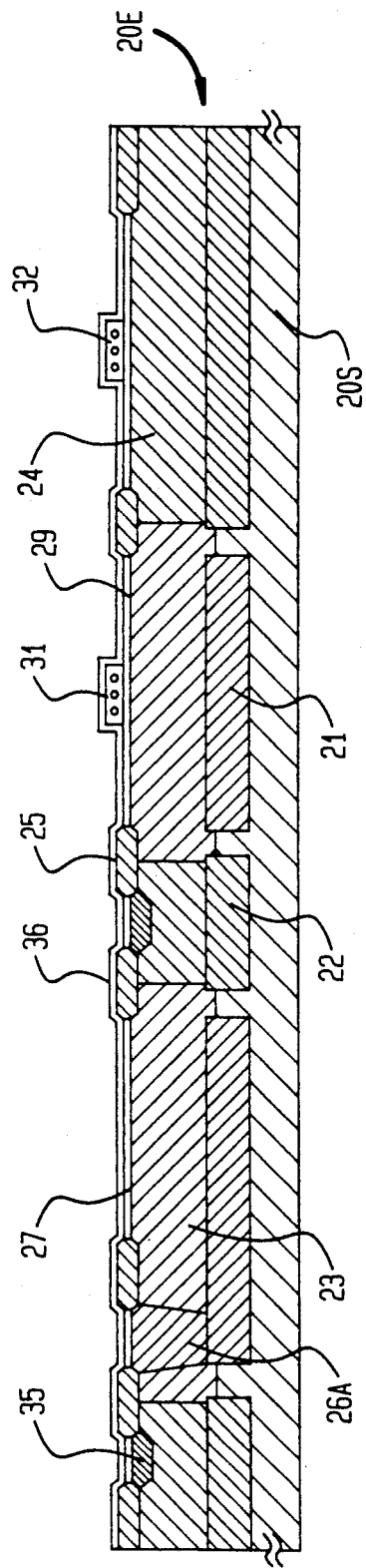
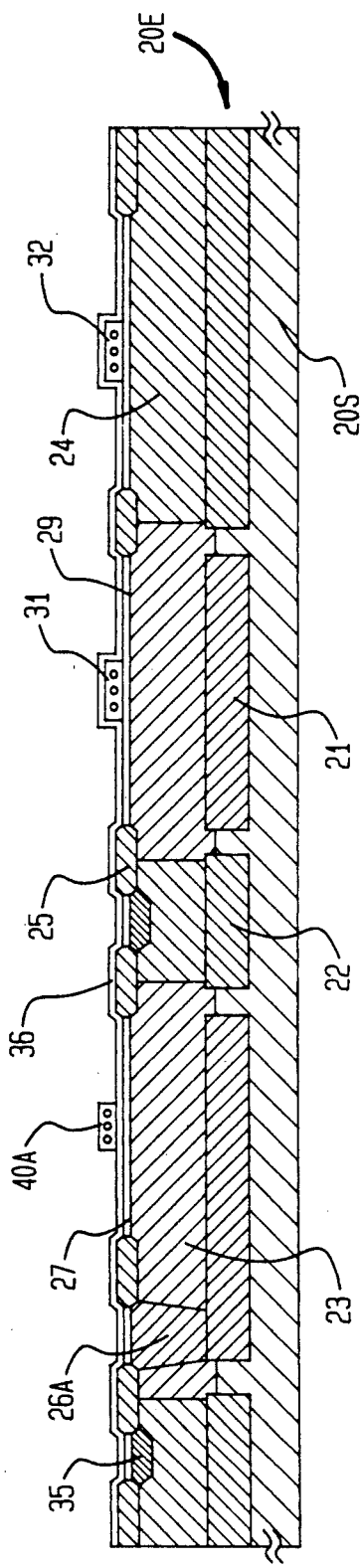

SEMICONDUCTOR DEVICE AND METHOD OF MANUFACTURING THE SAME

BACKGROUND OF THE INVENTION

1. Field of the Invention

The present invention relates to a semiconductor device and method of manufacturing the same, and more particularly to a transistor device having one or more bipolar transistors and one or more MOS transistors integrated on one semiconductor substrate, and also to a method of manufacturing the same.

2. Description of the Prior Art

Recently, extensive attempts have been made to develop semiconductor devices having a so-called Bi-CMOS structure in which a bipolar transistor and complementary MOS transistors (CMOS transistors) integrated on one semiconductor substrate. Hereinafter, such a semiconductor device having a Bi-CMOS structure is often referred to as merely "Bi-CMOS".

FIG. 27 shows a conventional Bi-CMOS. This Bi-CMOS comprises: a P-silicon substrate 1 having an N+-buried region 2 formed on its surface; an N-epitaxial layer 4 formed on the P-silicon substrate 1; a field oxide 6 formed adjacent the top surface of the N-epitaxial layer 4 and in an isolation region of a P+-buried region 3 formed in the N-epitaxial layer 4 below the field oxide 6 in such a manner that it surrounds a region formed where the field oxide 6 is not formed (hereinafter, such a region is referred to as "an active region"), and reaches the substrate 1; a vertical bipolar transistor VBT formed in a portion of the active region within the N-epitaxial layer 4; two MOS transistors MT formed in the other portion of the field oxide region within the N-epitaxial layer 4; and an insulating layer 14 formed so as to cover the bipolar transistor VBT, the MOS transistors MT and the field oxide 6.

The vertical bipolar transistor VBT has a P-base region 7 formed within the N-epitaxial layer 4, an N-emitter region 9 within the P-base region 7, a gate oxide 8 formed on the emitter region 9, an emitter diffusion window 15 formed in a predetermined portion of the gate oxide 8, and an emitter electrode 11 formed on the gate oxide 8 for contact with the N-emitter region 9 through the emitter diffusion window 15.

One of the MOS transistors MT is an N-type MOS transistor having a P-well region 5 formed in the N-epitaxial layer 4, a gate oxide 8 formed on the P-well region 5, a gate electrode 10 formed on the gate oxide 8, and an N+-diffusion region 13 formed adjacent to the surface of the P-well region in a region where the gate electrode 10 is not formed. A contact window 17 for interconnecting the N+-diffusion region 13 and a metal wiring layer (not shown) is formed in a specified portion of the insulating layer 14 on the N+-diffusion region 13.

The other MOS transistor is a P-type MOS transistor having a gate oxide 8 formed on the N-epitaxial layer 4, a gate electrode 10 on the gate oxide 8, and a P+-diffusion region 12 formed adjacent to the surface of the N-epitaxial layer 4 in a region where the gate electrode 10 is not formed. A contact window 18 for interconnecting the P+-diffusion region 12 and a metal wiring layer (not shown) is formed in a specified portion of the insulating layer 14 on the P+-diffusion region 12.

When manufacturing the Bi-CMOS of FIG. 27, the emitter diffusion window 15 for the bipolar transistor VBT is formed after the gate oxide 8, and before a poly-Si film (which serves as the gate electrode 10 and emitter electrode 11) are deposited on the gate oxide 8. According to this method, the surface of the P-base region 7 in a region where the emitter region 9 is to be formed is exposed as a result of the formation of the emitter diffusion window 15. This involves a problem in that P-type impurities come out from the exposed P-base region 7 to contaminate the gate oxide 8 before the poly-Si film which serves as the emitter electrode 11 is deposited on the gate oxide 8.

In this method, when the poly-Si film has been deposited on a wafer after the formation of the emitter diffusion window 15, there may remain an oxide film in the interface between the P-base region 7 within the emitter diffusion window 15 and the poly-Si film (i.e., the emitter electrode 11). This oxide film is a native oxide grown by the oxidation of the surface of the P-base region 7 exposed through the emitter window 15, after the formation of the emitter window 15. If the native oxide film is thick, the trouble is caused in that the diffusion of impurities for forming the emitter region 9, from the poly-Si film to the P-base region 7 may not be properly effected. Even if the emitter region 9 is formed, moreover, the presence of the native oxide film may cause an excessive electric resistance to be formed between the emitter region 9 and the emitter electrode 11. Therefore, it is necessary to carry out an etching process in order to remove the native oxide film immediately before the poly-Si film serving as the emitter electrode 11 is formed on the wafer. In the above prior art technique, however, the gate oxide 8 is exposed on the wafer during the etching process, and hence the surface of the gate oxide 8 is also subject to the etching. Where the gate oxide 8 is designed so as to be as thin as 10 nm or so, any decrease in the thickness of the gate oxide 8 causes a substantial degradation in the characteristics of the transistor. If pin holes are formed in the gate oxide 8, serious trouble is caused in that no proper operation of the transistor can be realized.

The insulation between the emitter electrode 11 and the P-base region 7 is provided by the gate oxide 8 formed below the emitter electrode 11. If the thickness of the gate oxide 8 is reduced as a result of the etching process, therefore, the dielectric strength of the interface between the emitter electrode 11 and the P-base region 7 degrades, with the result that a leakage current will flow between the emitter electrode 11 and the P-base region 7.

In the MOS transistors MT, the P+-diffusion region 12 and N+-diffusion region 13 are formed in self-aligned relation with respect to the gate electrode 10 by the ion implantation technique in which the gate electrode 10 is used as a mask. If both the diffusion regions 12 and 13 are diffused laterally, the diffusion regions 12, 13 will find their way into a region below the gate electrode 10, with the result that the effective channel length of the MOS transistors is reduced. Recent micronized MOS transistors have a gate electrode 10 with a gate length of the order of, for example, 800 nm. Such micronized transistors involve an inherent problem in that the reduced channel length due to the lateral diffusion of the diffusion regions 12 and 13 causes the performance characteristics of the transistors to degrade considerably.

Moreover, in the bipolar transistor of a conventional Bi-CMOS, the contact window 15 is formed in the base diffusion region 7, which is an active base diffusion region, resulting in that the base contact resistance and the base resistance are further increased.

SUMMARY OF THE INVENTION

An object of the invention is to provide a semiconductor device in which, even though the surface of a base region may be exposed as a result of the formation of an emitter diffusion window, a gate oxide is not contaminated with impurities from the exposed base region.

Another object of the invention is to provide a semiconductor device having a structure in which a gate oxide can is formed without subjecting the gate oxide to be etched in the process of etching a native oxide film which is on a base region exposed through an emitter diffusion window.

A further object of the invention is to provide a semiconductor device having MOS transistors which are not degraded in the transistor characteristics due to the lateral diffusion of P- and N-diffusion regions formed in self-aligned relation to corresponding gate electrodes.

A still further object of the invention is to provide a semiconductor device having a bipolar transistor with a reduced base contact resistance and reduced base resistance.

A still further object of the invention is to provide a method of manufacturing a semiconductor device which, even though the surface of a P-base region may be exposed as a result of the formation of an emitter diffusion window, can prevent a gate oxide from being contaminated with impurities from the exposed base region.

A still further object of the invention is to provide a method of manufacturing a semiconductor device in which a gate oxide is not etched when a natural oxide film formed on a base region exposed through an emitter diffusion window is etched.

A still further object of the invention is to provide a method of manufacturing a semiconductor device having MOS transistors in which the P- and N-diffusion regions can be formed in a self-aligned relationship to corresponding gate electrodes, without degrading the transistor characteristics.

A still further object of the invention is to provide a method of manufacturing a semiconductor device having a bipolar transistor which has a reduced base contact resistance and reduced base resistance.

According to this invention, a semiconductor device comprising at least one vertical bipolar transistor and at least one MOS transistor, said bipolar and MOS transistors being formed on one semiconductor substrate, is provided, wherein said MOS transistor comprises; a gate electrode made of a first conductive thin film; and sidewall spacers formed on the sides of said gate electrode, said sidewall spacers including at least one deposition film, and said vertical bipolar transistor comprises: an emitter electrode made of a second conductive thin film; and an emitter diffusion window formed in said deposition film which is disposed under said emitter electrode.

According to this invention, a semiconductor device comprising at least one vertical bipolar transistor and at least one MOS transistor, said bipolar and MOS transistors being formed on one semiconductor substrate is provided, wherein said MOS transistor comprises: a gate electrode made of a first conductive thin film; and first sidewall spacers formed on the sides of said gate electrode, said first sidewall spacers including a first deposition film and a second deposition film, and said vertical bipolar transistor comprises: an emitter electrode made of a second conductive thin film; an emitter diffusion window formed in said first deposition film which is disposed under said emitter electrode; and second sidewall spacers formed on the sides of said emitter electrode, said sidewall spacers including said second deposition film.

According to this invention, a semiconductor device comprising at least one lateral bipolar transistor and at least one MOS transistor, said bipolar and MOS transistors being formed on one semiconductor substrate is provided, wherein said MOS transistor comprises; a gate electrode made of a first conductive thin film; and sidewall spacers formed on the sides of said gate electrode, said sidewall spacers including at least one deposition film, and said lateral bipolar transistor comprises: a base width defining means for defining the base width; and an insulation means formed between said base width defining means and the collector and emitter, said insulation means including said deposition film.

According to this invention, a semiconductor device comprising at least one lateral bipolar transistor and at least one MOS transistor, said bipolar and MOS transistors being formed on one semiconductor substrate is provided, wherein said MOS transistor comprises: a gate electrode made of a first conductive thin film; and first sidewall spacers formed on the sides of said gate electrode, said first sidewall spacers including a first deposition film and a second deposition film, and said lateral bipolar transistor comprises: a base width defining means for defining the base width; an insulation means formed between said base width defining means and the collector and emitter, said insulation means including said first deposition film; and second sidewall spacers formed on the sides of said base width defining means, said sidewall spacers including said second deposition film.

According to this invention, a method of manufacturing a semiconductor device comprising at least one vertical bipolar transistor and at least one MOS transistor, said bipolar and MOS transistors being formed on one semiconductor substrate is provided, comprising the steps of: forming a gate oxide film at least in the MOS transistor region on the main surface of said semiconductor substrate; forming a gate electrode of said MOS transistor on said gate oxide film, said gate electrode being made of a first conductive thin film; forming a deposition film on said semiconductor substrate; etching said deposition film at least in the bipolar transistor region to form an emitter diffusion window; and forming an emitter electrode of said bipolar transistor over said emitter diffusion window, said emitter electrode being made of a second conductive thin film and being larger in size than said emitter diffusion window.

According to this invention, a method of manufacturing a semiconductor device comprising at least one vertical bipolar transistor and at least one MOS transistor, said bipolar and MOS transistors being formed on one semiconductor substrate is provided, comprising the steps of: forming a gate oxide film at least in the MOS transistor region on the main surface of said semiconductor substrate; forming a gate electrode of said MOS transistor on said gate oxide film, said gate electrode being made of a first conductive thin film; forming a deposition film on said semiconductor substrate; etching said deposition film at least in the bipolar transistor region to form an emitter diffusion window; forming an emitter electrode of said bipolar transistor over said emitter diffusion window, said emitter electrode being made of a second conductive thin film and being larger in size than said emitter diffusion window; and etching further said deposition film by using the anisotropic dry etching technique, to form sidewall spacers on the sides of said gate electrode, said sidewall spacers being made of said deposition film, and to leave said deposition film under said emitter electrode.

In a preferred embodiment, said method further comprises a step of forming source and drain diffusion regions of said MOS transistor and also an external base diffusion region of said vertical bipolar transistor, after the step of etching further said deposition film by using an anisotropic dry etching technique.

According to this invention, a method of manufacturing a semiconductor device of this invention comprises at least one vertical bipolar transistor and at least one MOS transistor, said bipolar and MOS transistors being formed on one semiconductor substrate is provided, comprising the steps of: forming a gate oxide film at least in the MOS transistor region on the main surface of said semiconductor substrate; forming a gate electrode of said MOS transistor on said gate oxide film, said gate electrode being made of a first conductive thin film; forming a first deposition film on said semiconductor substrate; etching said first deposition film at least in the bipolar transistor region to form an emitter diffusion window; forming an emitter electrode of said bipolar transistor over said emitter diffusion window, said emitter electrode being made of a second conductive thin film and being larger in size than said emitter diffusion window; and forming a second deposition film on said semiconductor substrate; etching further said first and second deposition films by using the anisotropic dry etching technique, to form first sidewall spacers on the sides of said gate electrode, said first sidewall spacers being made of said first and second deposition films, to leave said first deposition film under said emitter electrode, and to form second sidewall spacers on the sides of said emitter electrode, said second sidewall spacers being made of said second deposition film.

In a preferred embodiment, said method further comprises a step of forming source and drain diffusion regions of said MOS transistor and also an external base diffusion region of said vertical bipolar transistor, after the step of etching further said first and second deposition films by using an anisotropic dry etching technique.

According to this invention, a method of manufacturing a semiconductor device comprising at least one lateral bipolar transistor and at least one MOS transistor, said bipolar and MOS transistors being formed on one semiconductor substrate is provided, comprises the steps of: forming a gate oxide film at least in the MOS transistor region on the main surface of said semiconductor substrate; forming a gate electrode of said MOS transistor on said gate oxide film, said gate electrode being made of a first conductive thin film; forming a deposition film on said semiconductor substrate; and forming a base width defining means for defining the base width of said bipolar transistor, said base width defining means being made of a second conductive thin film.

According to this invention, a method of manufacturing a semiconductor device comprising at least one lateral bipolar transistor and at least one MOS transistor, said bipolar and MOS transistors being formed on one semiconductor substrate is provided, comprising the steps of: forming a gate oxide film at least in the MOS transistor region on the main surface of said semiconductor substrate; forming a gate electrode of said MOS transistor on said gate oxide film, said gate electrode being made of a first conductive thin film; forming a deposition film on said semiconductor substrate; forming a base width defining means for defining the base width of said bipolar transistor, said base width defining means being made of a second conductive thin film; and etching said deposition film by using an anisotropic dry etching technique, to form sidewall spacers on the sides of said gate electrode, said sidewall spacers being made of said deposition film, and to leave said deposition film under said emitter electrode.

In a preferred embodiment, said method further comprises a step of forming source and drain diffusion regions of said MOS transistor and also an emitter and collector diffusion regions of said lateral bipolar transistor, after the step of etching said deposition film.

According to this invention, a method of manufacturing a semiconductor device comprising at least one lateral bipolar transistor and at least one MOS transistor, said bipolar and MOS transistors being formed on one semiconductor substrate is provided, comprising the steps of: forming a gate oxide film at least in the MOS transistor region on the main surface of said semiconductor substrate; forming a gate electrode of said MOS transistor on said gate oxide film, said gate electrode being made of a first conductive thin film; forming a first deposition film on said semiconductor substrate; forming a base width defining means for defining the base width of said bipolar transistor, said base width defining means being made of a second conductive thin film; and forming a second deposition film on said semiconductor substrate; etching said first and second deposition films by using an anisotropic dry etching technique, to form first sidewall spacers on the sides of said gate electrode, said first sidewall spacers being made of said first and second deposition films, to leave said first deposition film under said base width defining means, and to form second sidewall spacers on the sides of said base width defining means, said second sidewall spacers being made of said second deposition film.

In a preferred embodiment, said method further comprises a step of forming source and drain diffusion regions of said MOS transistor and also an emitter and collector diffusion regions of said lateral bipolar transistor, after the step of etching said first and second deposition films.

BRIEF DESCRIPTION OF THE DRAWINGS

This invention may be better understood and its numerous objects and advantages will become apparent to those skilled in the art by reference to the accompanying drawings as follows:

FIGS. 2 to 11 illustrate steps of manufacturing the Bi-CMOS of FIG. 1A.

FIGS. 17 to 26 illustrate steps of manufacturing the Bi-CMOS of FIG. 16A.

DESCRIPTION OF THE PREFERRED EMBODIMENTS

Example 1

Figure 1A:
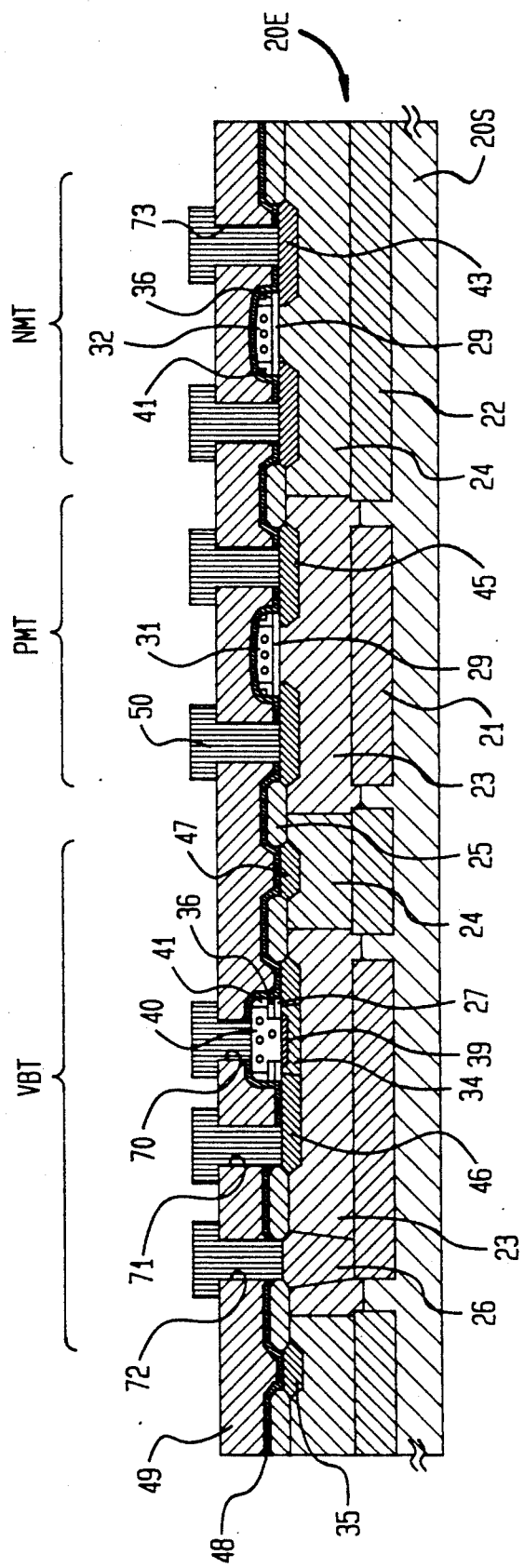
FIG. 1A is a partial sectional view of a Bi-CMOS according to the invention.

FIG. 1A shows a Bi-CMOS according to the invention. The Bi-CMOS of FIG. 1A comprises: a P-single crystal silicon substrate 20S having an N+-buried region 21 and a P$^{30}$-buried region 22 formed in specified regions adjacent to the top surface of the substrate 20S; an epitaxial layer 20E formed over the entire surface of the substrate 20S; a field oxide (SiO$_2$) film 25 formed adjacent to the top surface of the epitaxial layer 20E and within isolation regions in which no element is to be formed; a vertical NPN bipolar transistor VBT formed in a portion of an active region of the epitaxial layer 20E; MOS transistors PMT and NMT formed in other portions of the active region of the epitaxial layer 20E, an Si$_3$N$_4$ film 48 formed so as to cover the vertical NPN bipolar transistor VBT, MOS transistor PMT and NMT, and field oxide film 25; a BPSG film 49 formed on the Si$_3$N$_4$ film 48; and a metal wiring layer 50 formed on the BPSG film 49.

Figure 1B:
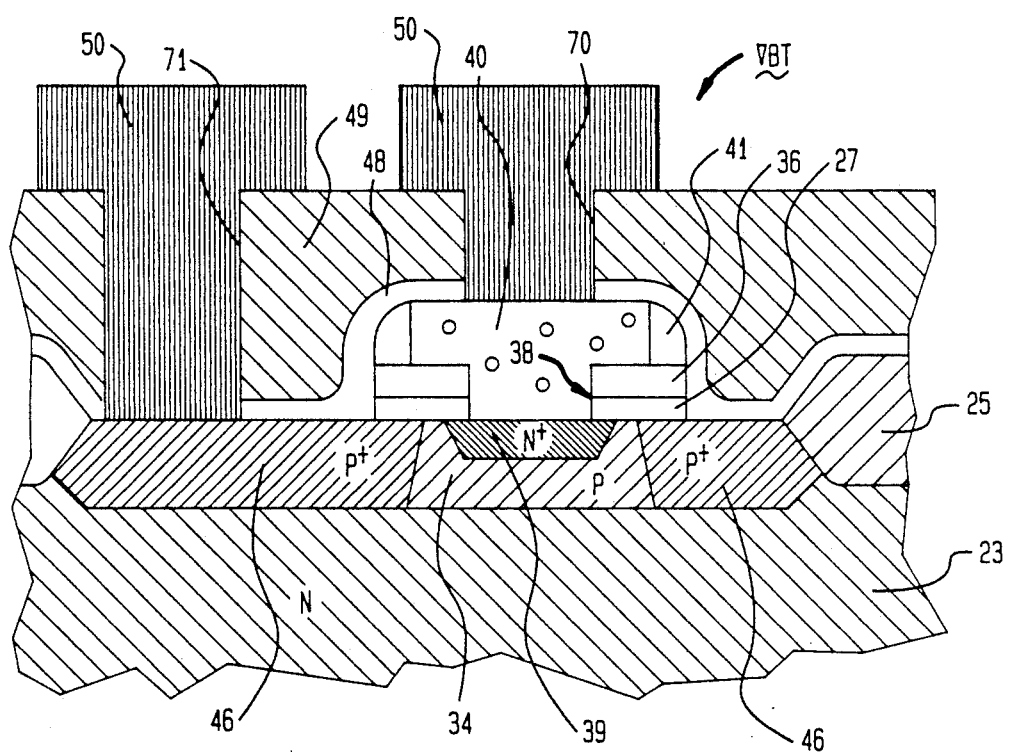
FIG. 1B shows a vertical bipolar transistor formed in the Bi-CMOS of FIG. 1A.

As shown in FIG. 1B, the vertical NPN bipolar transisotr VBT has an N-well 23 formed in the epitaxial layer 20E, a P-base region 34 formed in an upper portion of the N-well 23, an N+-emitter region 39 formed in an upper portion of the P-base region 34, an oxide (SiO$_2$) film 27 formed on the surface of the epitaxial layer 20E, a first deposition film 36 formed on the oxide film 27, an emitter diffusion window 38 formed in the first deposition film 36 and oxide film 27, and an emitter polysilicon electrode 40 which contacts the N+-emitter region 39 through the emitter diffusion window 38.

A second deposition film 41 which functions as a sidewall spacer is provided at the sides of the emitter electrode 40 and on the first deposition film 36. Under both the emitter electrode 40 and second deposition film 41, consequently, the first deposition film 36 is formed.

A P+-external base diffusion region 46 is formed in the P-base region 34 in such a manner that it surrounds the N+-emitter 39. In specified portions of the BPSG film 49 and Si$_3$N$_4$ film 48 on the P+-external base diffusion region 46 and emitter electrode 40, formed are contact windows 70 and 71 through which the emitter electrode 40 and P+-external base diffusion region 46 are connected with the metal wiring layer 50, respectively. An N+-collector wall diffusion region 26 connected to the N+-buried region 21 is formed within the N-well 23 and in a region opposite to the P+-external base region 46 across the field oxide film 25 in the N-well. In the BPSG film 49 and Si$_3$N$_4$ film 48 on the N+-collector wall diffusion region 26, there is formed a contact window 72 for connecting the N+-collector wall diffusion region 26 to the metal wiring layer 50.

Figure 1C:
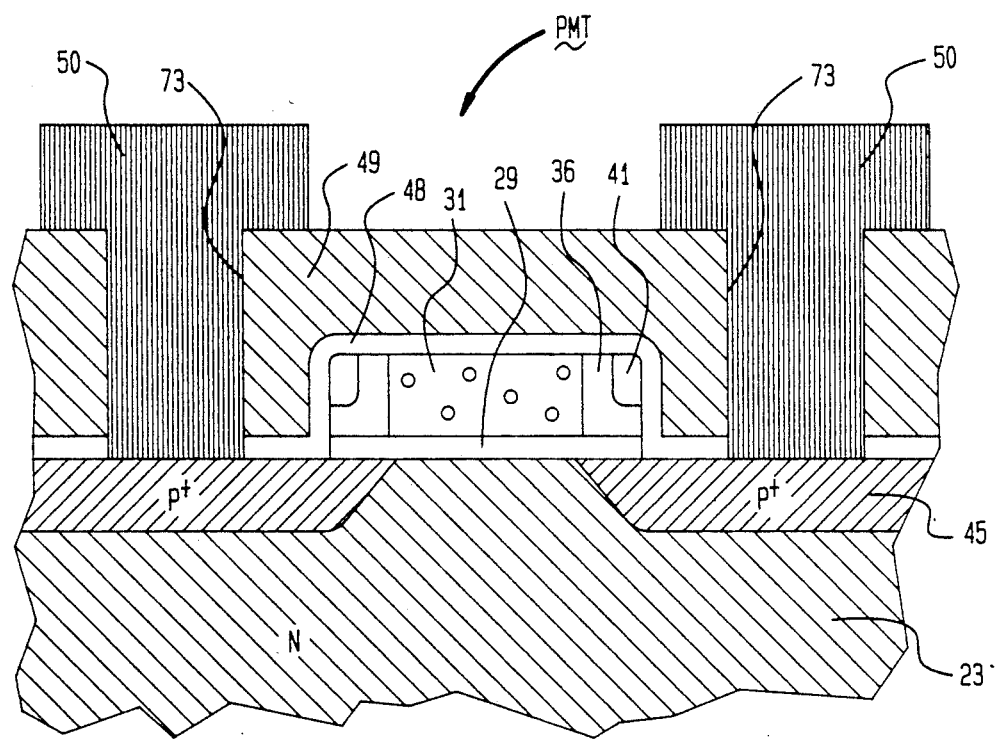
FIGS. 1C and 1D show MOS transistors formed in the Bi-CMOS of FIG. 1A.

FIG. 1C shows the P-channel MOS transistor PMT having a gate oxide film 29 formed over an N-well region 23 which is formed in the epitaxial layer 20E, a gate electrode 31 formed on the gate oxide film 29, and P+-diffusion regions 45 formed adjacent to the surface of the N-well region 23 in the region in which the gate electrode 31 is not formed. The P+-diffusion regions 45 function respectively as a source and a drain. In the BPSG film 49 and Si$_3$N$_4$ film 48 on the P+-diffusion regions 45, formed are contact windows 73 for respectively connecting the P+-diffusion regions 45 to the metal wiring layer 50.

Figure 1D:
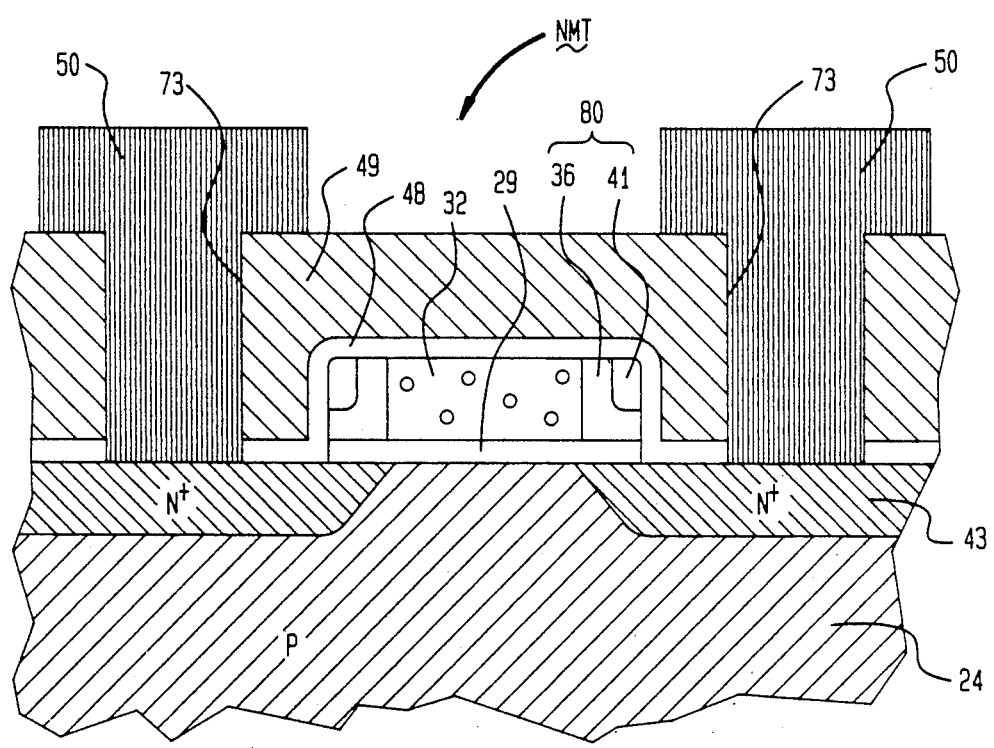

As shown in FIG. 1D, the N-channel MOS transistor NMT has a gate oxide film 29 formed over a P-well region 24 which is formed in the epitaxial layer 20E, a gate electrode 32 formed on the gate oxide film 29, N+-diffusion regions 43 formed adjacent to the surface of the P-well region 24 in the region in which the gate electrode 32 is not formed. The N+-diffusion regions 43 function as a source or a drain. In the BPSG film 49 and Si$_3$N$_4$ film 48 on the N+-diffusion regions 43, formed are contact windows 73 for respectively connecting the N+-diffusion regions 43 to the metal wiring layer 50.

In the MOS transistors PMT and NMT, a sidewall spacer 80 is disposed on each of the sides of the gate electrodes 31 and 32. The sidewall spacers 80 is formed by the first deposited film 36 and the second deposited films 41 which are placed in that order from the gate electrode side.

As described above, this embodiment has a Bi-CMOS structure in which the vertical bipolar transistor VBT and the P-channel and N-channel MOS transistors PMT and NMT are formed on one substrate 20S, and the P-channel and N-channel MOS transistors PMT and NMT are complementary connected to form a CMOS structure. The active regions where these transistors are respectively formed are separated from each other by the field oxide (SiO$_2$) film 25.

Figure 2:
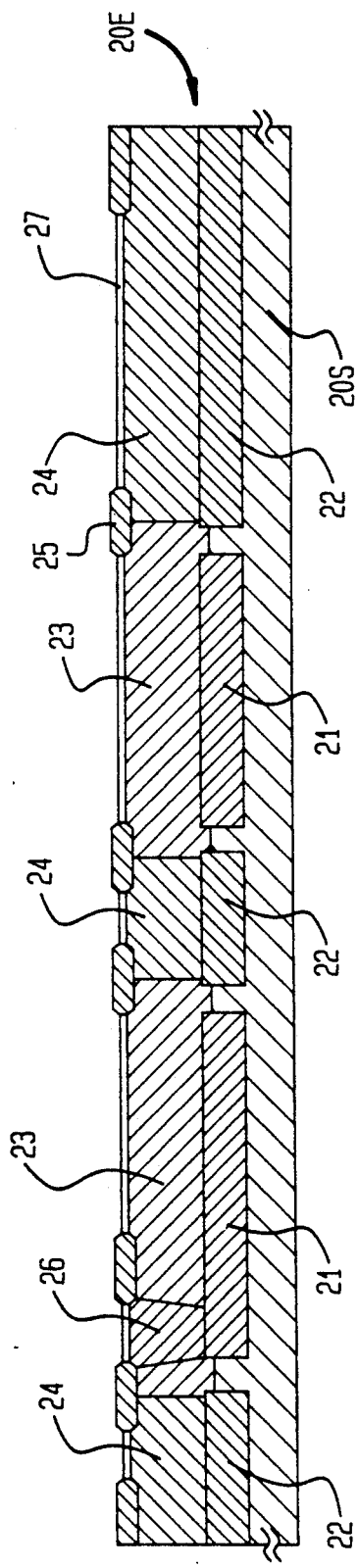

A method of manufacturing the Bi-CMOS of FIG. 1A will be described with reference to FIGS. 2 to 11. First, the N-type epitaxial layer 20E was formed on the single crystal silicon substrate 20S with the N+- buried region 21 and P+-buried region 22 previously formed on the surface. P-type or N-type impurities were diffused into selected regions within the epitaxial layer 20E, thereby forming the P-well 24 or the N-well 23 in the epitaxial layer 20E. The field oxide film 25 was formed in regions other than the active regions by using the LOCOS technique. Thereafter, the Si$_3$N$_4$ film (not shown) used in the LOCOS process was removed. In this removal process, the SiO$_2$ film 27 formed under the Si$_3$N$_4$ film was not removed. Subsequently, the N+-collector wall diffusion region 26 for the vertical NPN bipolar transistor VBT was formed (FIG. 2).

Figure 3:
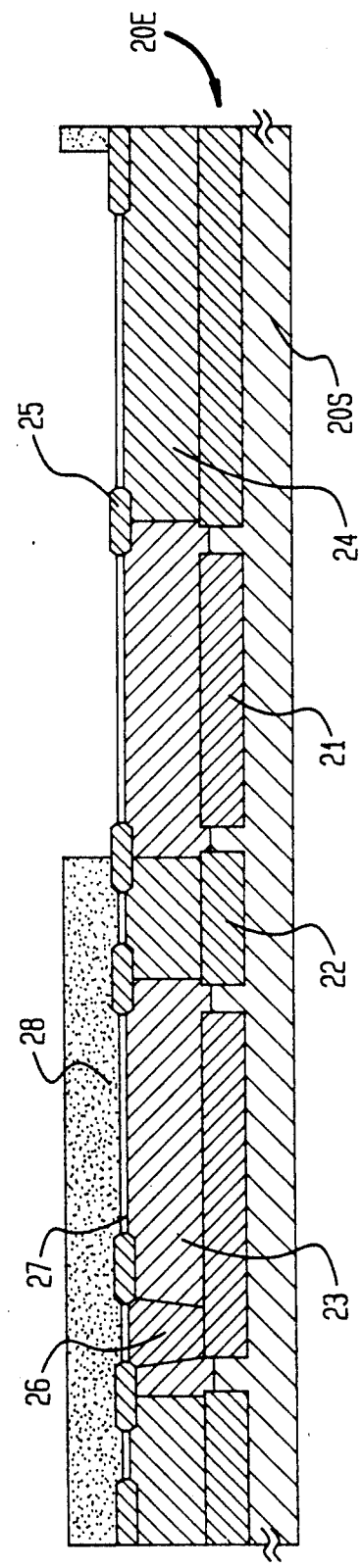

A photoresist 28 having a pattern covering regions other than the MOS transistor region was formed over the field oxide film 25 and SiO$_2$ film 27 on the epitaxial layer 20E, and then the SiO$_2$ film 27 in the MOS transistor region not covered by the photoresist 28 was removed to expose the surface of the MOS transistor region of the epitaxial layer 20E (FIG. 3). In the embodiment, the SiO$_2$ film 27 in the bipolar transistor region was not removed so that the non-removed SiO$_2$ film 27 prevents the outward diffusion of the collector wall diffusion region 26 from occurring. When the outward diffusion from the collector wall diffusion region 26 is insignificant, the SiO$_2$ film 27 over the bipolar transistor region may be removed.

After the removal of the photoresist 28, the surface of the epitaxial layer 20E in the MOS transistor region was subjected to oxidization, whereby the gate oxide film 29 was formed on the surface of the epitaxial layer in the MOS transistor region. In succession to the oxidizing process, a non-doped first poly-Si film was deposited on the wafer. Then, the first poly-Si film was doped with impurities to lower its resistance. Alternatively, a doped poly-Si film containing impurities may be deposited on the wafer to obtain the low-resistance first poly-Si film. A photoresist 30 having a pattern which defines the patterns of the gate electrodes 31 and 32 was formed on the first poly-Si film, and the first poly-Si film was etched by using the photoresist 30 as a mask to form the gate electrodes 31 and 32 (FIG. 4).

A photoresist 33 was formed, and patterned as shown in FIG. 5. Using this patterned photoresist 33 as a mask, Boron was doped in the isolation region for isolating the bipolar transistor VBT from other elements (not shown) and also in the base region of the bipolar transistor VBT by the ion implantation technique. Thus, the P-base diffusion regions 34 and P+-diffusion regions 35 were formed (FIG. 5).

Then, $SiO_2$ film 36 (thickness: 100 nm) which is the first deposition film was formed over the wafer by using the LPCVD (Low Pressue Chemical Vapor Deposition) technique. After a photoresist 37 having a pattern for the emitter diffusion window 38 was formed on the $SiO_2$ film 36, the $SiO_2$ films 36 and 27 were etched using the photoresist 37 as a mask to form the emitter diffusion window 38 (FIG. 6).

In order to remove the thin native oxide film on the surface of the P-base region 34 exposed in the emitter diffusion window 38, the wafer was immersed in a suitable HF etchant for a predetermined period of time.

A second poly-Si film serving as the emitter electrode 40 of the bipolar transistor VBT was deposited on the wafer, and then doped with As by using the ion implantation technique. Thereafter, the wafer was heat treated or annealed so that a portion of the P-base diffusion region 34 was doped with As from the As-doped second poly-Si film through the emitter diffusion window 38, thereby forming the N+-emitter diffusion region 39 in the P-base diffusion region 34. A photoresist (not shown) having a pattern defining the emitter electrode 40 was formed on the second poly-Si film. Subsequently, by etching the second poly-Si film with using the photoresist as a mask, the emitter electrode 40 was formed over a region including the region in which the emitter difffusion window 38 was formed, and wider than the emitter diffusion window 38 (FIG. 7). Alternatively, the N+-emitter diffusion region 39 may be formed by doping As with the ion implantation technique onto the surface of the P-base diffusion region 34 exposed in the emitter diffusion window 38, before the deposition of the second poly-Si film.

In the embodiment, during the steps of forming the emitter diffusion window 38, depositing the second poly-Si film, and forming the emitter electrode 40, the MOS transistor region was covered with the $SiO_2$ film (the first deposition film) 36. Therefore, the MOS transistor region was not contaminated with P-type impurities from the P-base diffusion region 34 exposed in the emitter diffusion window 38. Since the gate oxide film 29 was covered with the first deposition film or $SiO_2$ film 36, furthermore, the gate oxide film 29 was prevented from being etched in the step of removing the native oxide present of the P-base region 34. Accordingly, there was no unfavorable degradation in the transistor characteristics of the device which may otherwise arise from the thickness reduction of the gate oxide film 29 or formation of pin holes in the gate oxide film 29. There was no possible degradation in dielectric strength between the emitter electrode 40 and the P-base region 34, with the result that no-leakage current flows between them.

Then, the second deposition film or $SiO_2$ film 41 (of 150 nm in thickness) was deposited over the entire surface of the wafer (FIG. 8).

The $SiO_2$ films 41, 36 and 29 were sequentially etched away by using the anisotropic etching technique to expose the surface of the epitaxial layer 20E (FIG. 9). In this etching process, it was required to expose the surface of the epitaxial layer 20E in the source and drain regions of the MOS transistors PMT and NMT, but it was not required to completely remove the $SiO_2$ films on the epitaxial surface 20E in the bipolar transistor region. Larger portions of the $SiO_2$ films 41, 36 and 29 were removed by the anisotropic etching, but the portions of the $SiO_2$ films 41 and 36 on the sides of the gate electrodes 31 and 32 remained to form the sidewall spacers 80 (of 250 nm in thickness). Under the emitter electrode 40 there remained the $SiO_2$ film (of 100 nm thick) 36, and at sides of the emitter electrode 40 there were formed sidewall spacers (of 150 nm thick) consisting of the $SiO_2$ film 41.

As shown in FIG. 10, then, a photoresist 42 was formed to cover the regions where the N-channel MOS transistor NMT was not to be formed. Using the photoresist 42 and gate electrode 32 as masks, As was implanted into the specified regions in the P-well 24 by the ion implantation technique. In this way, the N+-diffusion regions 43 which serve respectively as the source and the drain of the N-channel MOS transistor NMT were formed in a self-aligned manner with respect to the gate electrode 32 which has the sidewall spacers 80 on its sides. Immediately after the ion implantation process, the distance between the N+-diffusion region 43 as the source and the one as the drain was greater by the thicknesses of the sidewall spacers than the width of the gate electrode 32, because of the presence of the sidewall spacers 80. Therefore, even when the N+-diffusion regions 43 were expanded laterally as a result of the heat treatment or annealing described later, the N+-diffusion regions 43 were prevented from intruding into the region of the P-well 24 which is immediately under the gate electrode 32, with the result of little or no degradation of the transistor characteristics of the resulting N-channel MOS transistor NMT.

As shown in FIG. 11, a photoresist 44 was formed to cover the specified regions of the wafer. Using the photoresist 44, gate electrode 31 and emitter electrode 40 as masks, boron was implanted into the N-well 23, P-base diffusion region 34 and P-diffusion regions 35 by the ion implantation technique, thereby forming the P+-diffusion regions 45 and the P+-external base diffusion region 46, and making the concentration of the P+-diffusion regions 35 higher for the isolation of elements. The P+-diffusion regions 45 which serve respectively and the source as the drain of the P-channel MOS transistor PMT were formed in a self-aligned manner with respect to the gate electrode 31 which has the sidewall spacers 80 on its sides. In the same manner as described above, immediately after the ion implantation process, the distance between the P+-diffusion region 45 as the source and the one as the drain was greater by the thicknesses of the sidewall spacers than the width of the gate electrode 31, because of the presence of the sidewall spacers 80. Therefore, even when the P+-diffusion regions 45 were expanded laterally as a result of the heat treatment or annealing described below, the P+-diffusion regions 45 were prevented from intruding into the region of the N-well 23 which is immediately under the gate electrode 31, with the result of little or no degradation of the transistor characteristics of the P-channel MOS transistor PMT.

Because the SiO₂ films 36 and 27 were disposed under emitter electrode 40, and the sidewall spacers consisting of the SiO₂ film 41 were situated on the sides of the emitter electrode 40, boron was implanted into the P-active base diffusion region 34 located remote from the emitter diffusion region 39. Thus, the P+-external base diffusion regions 46 having a low resistance were formed in specified regions within the P-active base region 34, in a self-aligned relationship with respect to both the emitter electrode 40 and the N+-emitter region 39. Because of the existence of the P+-external base diffusion regions 46 having a low resistance, considerable improvement was obtained in the transistor characteristics of the resulting vertical NPN bipolar transistor VBT.

Thereafter, the Si₃N₄ film 48 and the BPSG film 49 were deposited on the wafer, and then the wafer was annealed, whereby smoothing the surface of the BPSG film 49. As a result of this heat treatment, the N+-diffusion regions 43 and P+-diffusion regions 45 expanded laterally to intrude somewhat under the sidewall spacers 80 for the gate electrodes 31 and 32 (i.e., the SiO₂ films 36 and 41), as shown in FIGS. 1C and 1D. The contact windows 70, 71, 72 and 73 were opened in the Si₃N₄ film 48 and BPSG film 49, and the metal wiring layer 50 was formed on the BPSG film 49. In this way, the Bi-CMOS of FIG. 1A was obtained.

According to the above-described method, the sidewall spacers 80 consisting of the first and second deposition films 36 and 41 were formed on the sides of the gate electrodes 31 and 32 of the MOS transistors. Furthermore, the first deposition film 36 was formed under the emitter electrode 40 of the vertical bipolar transistor, and the sidewall spacers consisting of the second deposition film 41 were formed on the sides of the emitter electrode 40. By adjusting the thickness of the first deposition film 36, the degree of the level difference appearing in a portion of the first deposition film 36 in which the emitter diffusion window 38 is formed can be moderated so that the emitter electrode 15 is prevented from being disconnected at a portion involving such a level difference. The necessary insulation between the emitter electrode 40 and the epitaxial layer 20E can be achieved arbitrarily by adjusting the thickness of the first deposition film 36. Futhermore, the thickness of the sidewall spacers for the gate electrodes 31 and 32 can be freely determined by adjusting the thickness of the first and second deposition films 36 and 41.

In the above-described method, as shown in FIGS. 6 and 7, each MOS transistor region was covered with the first deposition film or SiO₂ film 36 during the steps of forming the emitter diffusion window 38, depositing the second poly-Si film 41, and forming the emitter electrode 40. Therefore, the MOS transistor regions were not contaminated with P-type impurities from the P+-base diffusion region 34 exposed in the emitter diffusion window 38.

Since the gate oxide film 29 was covered with the first deposition film or SiO₂ film 36, the gate oxide film 29 was not etched when the native oxide present on the P-base region 34 exposed through the emitter diffusion window 38 was removed by etching. Therefore, any decrease in the thickness of the gate oxide film 29 and the formation of pin holes in the gate oxide film 29 were prevented from occurring, resulting in the desired transistor characteristics of the Bi-CMOS being obtained. Furthermore, the dielectric strength between the emitter electrode 40 and the P-base region 34 did not degrade so that there was no leakage current flowing between the emitter electrode 40 and the P-base region 34.

Example 2

Figure 12A:
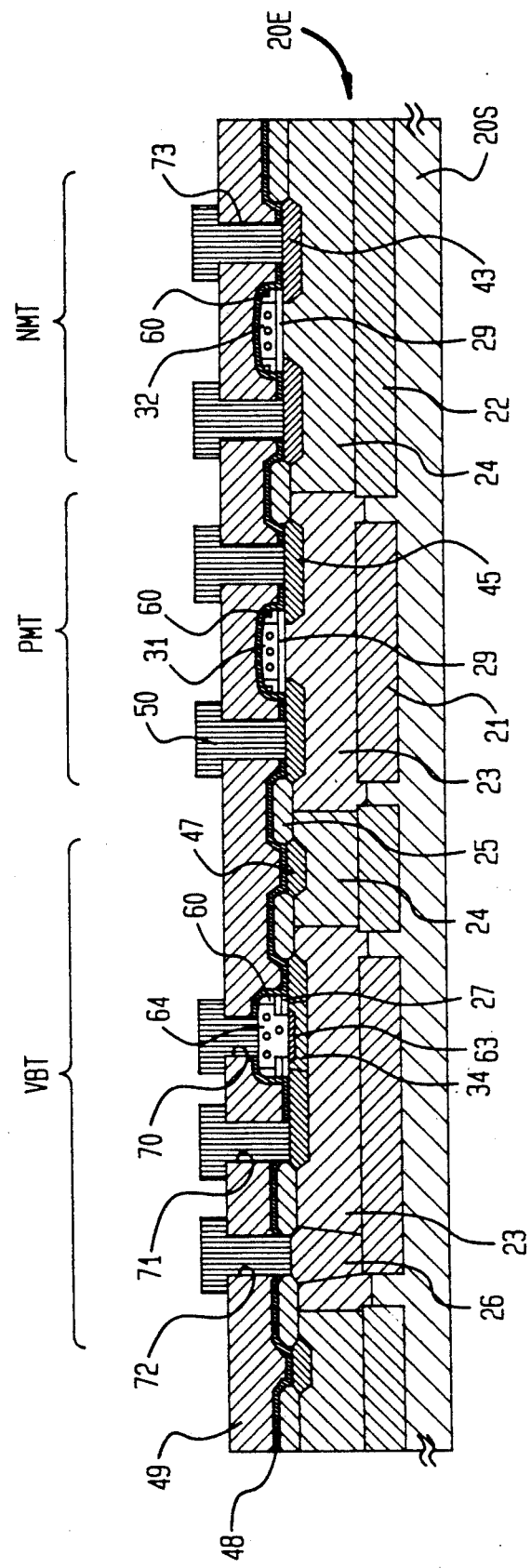
FIG. 12A is a partial sectional view of another Bi-CMOS according to the invention.
Figure 12B:
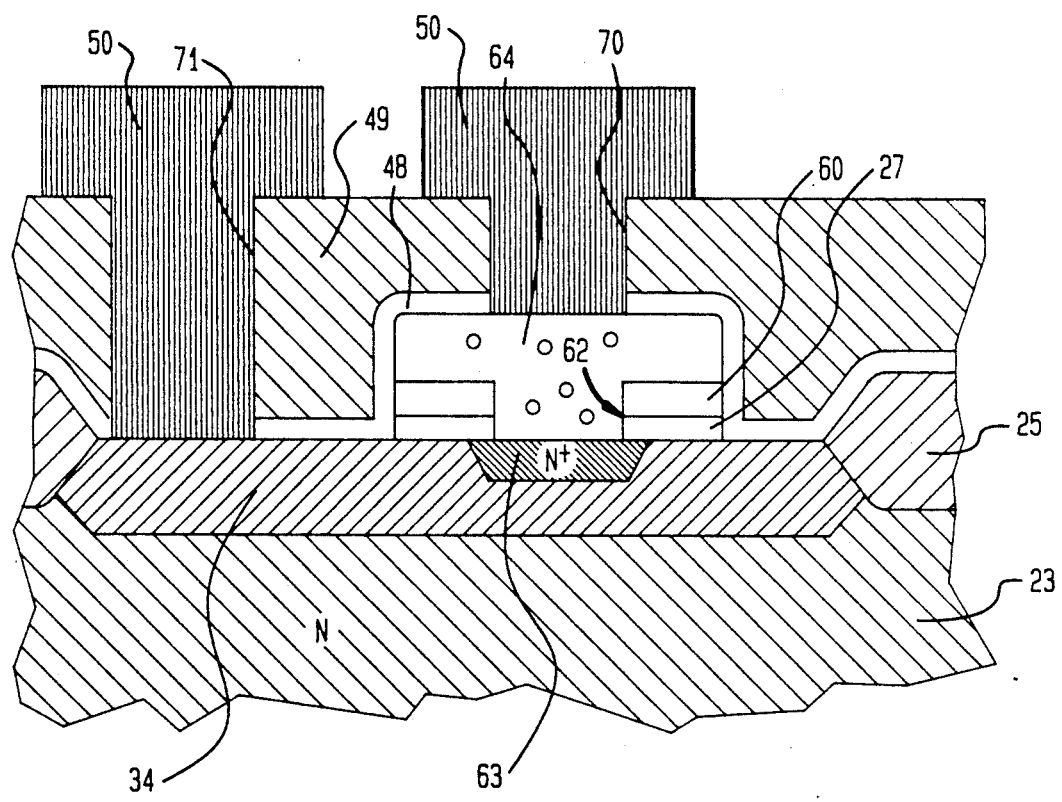
FIG. 12B shows a vertical bipolar transistor formed in the Bi-CMOS of FIG. 12A.
Figure 12C:
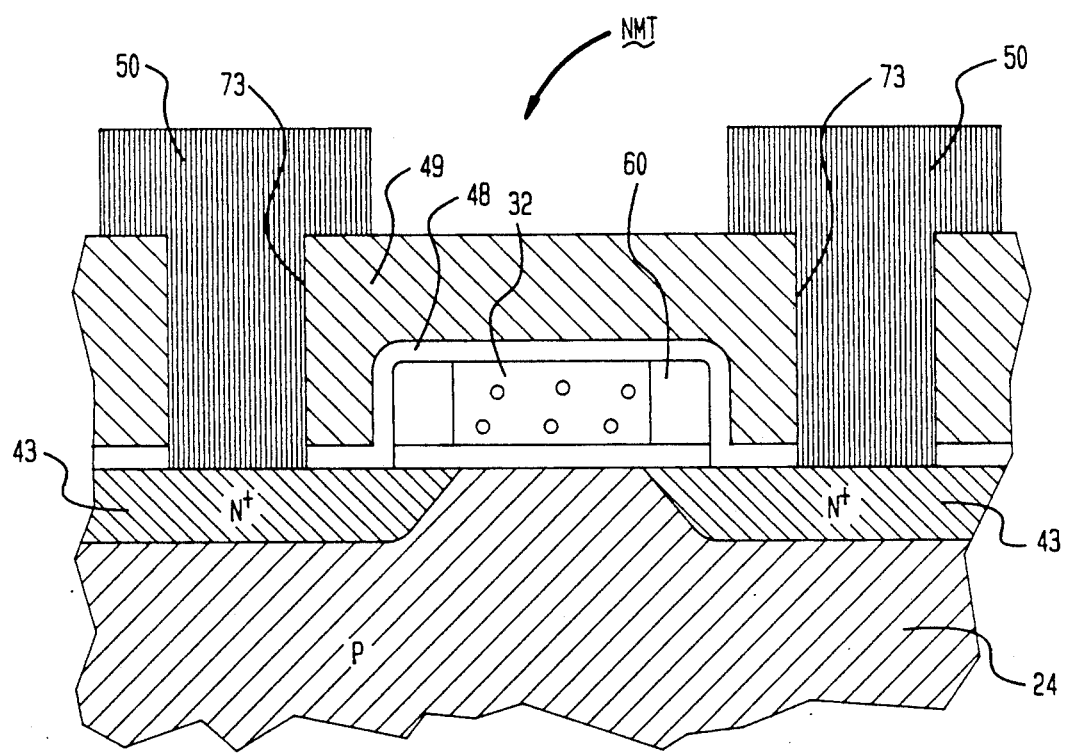
FIGS. 12C and 12D show MOS transistors formed in the Bi-CMOS of FIG. 12A.
Figure 12D:
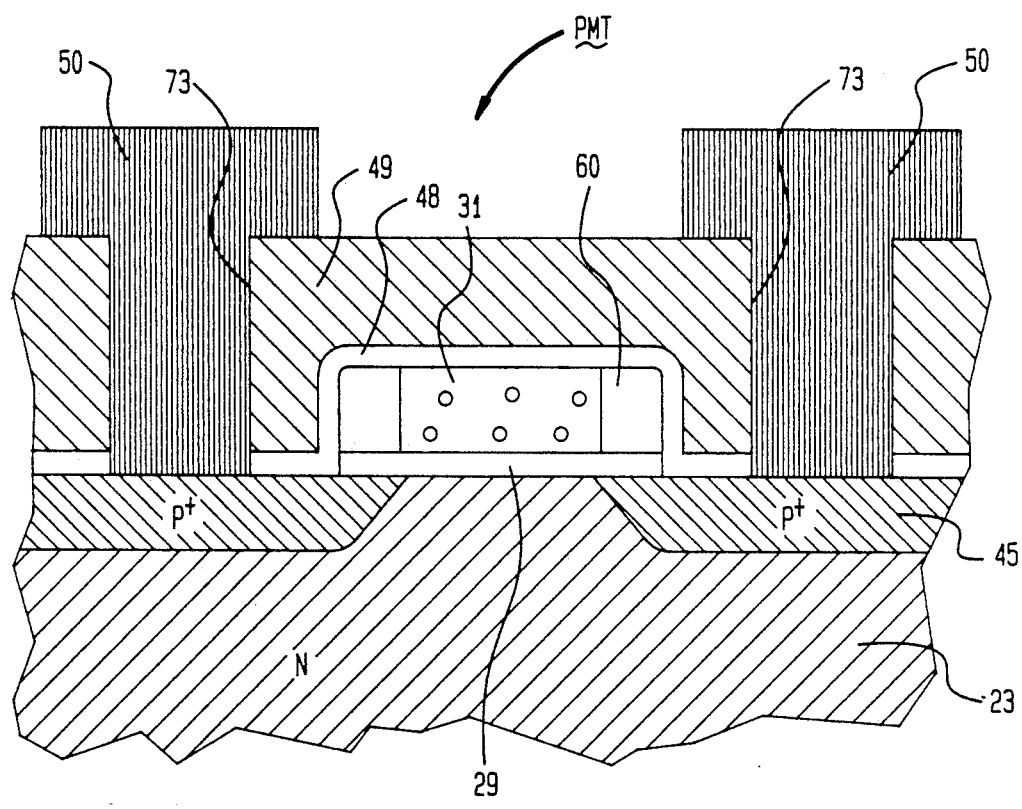

Another Bi-CMOS according to the invention is shown in FIG. 12A. FIGS. 12B to 12D illustrate a vertical NPN bipolar transistor VBT, a P-channel MOS transistor PMT and an N-channel MOS transistor NMT of the Bi-CMOS of FIG. 12A, respectively. In this embodiment, sidewall spacers consisting of a deposition film 60 are formed on the sides of gate electrodes 31 and 32 of the MOS transistors, and the deposition film 60 is also formed under an emitter electrode 64 of the vertical NPN bipolar transistor.

Figure 13:
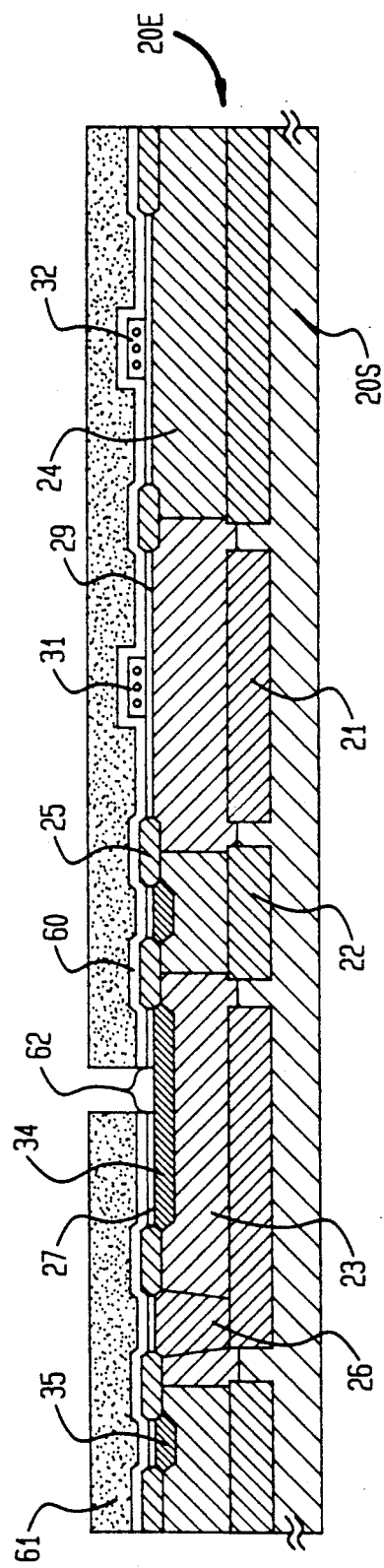
FIGS. 13 to 15 illustrate steps of manufacturing the Bi-CMOS of FIG. 12A.
Figure 14:
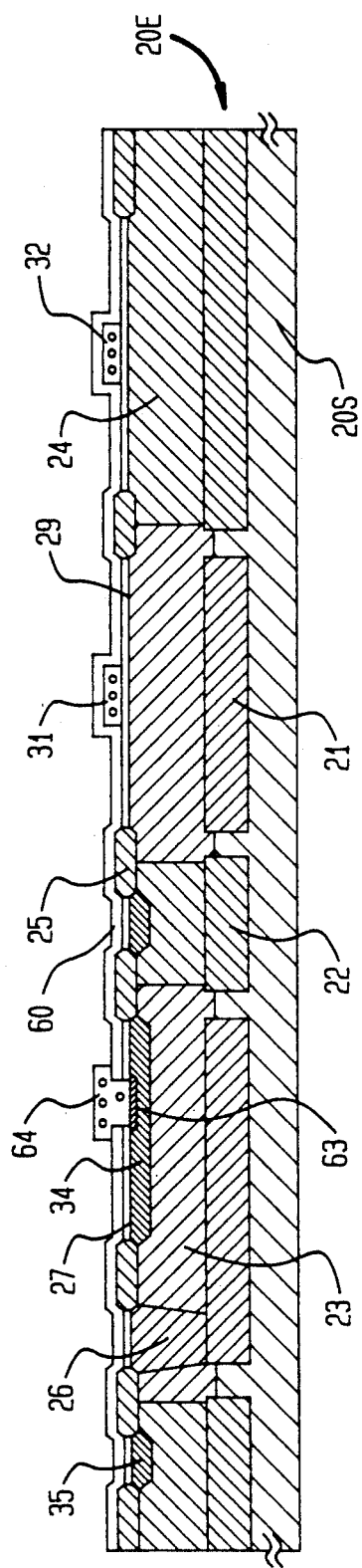
Figure 15:
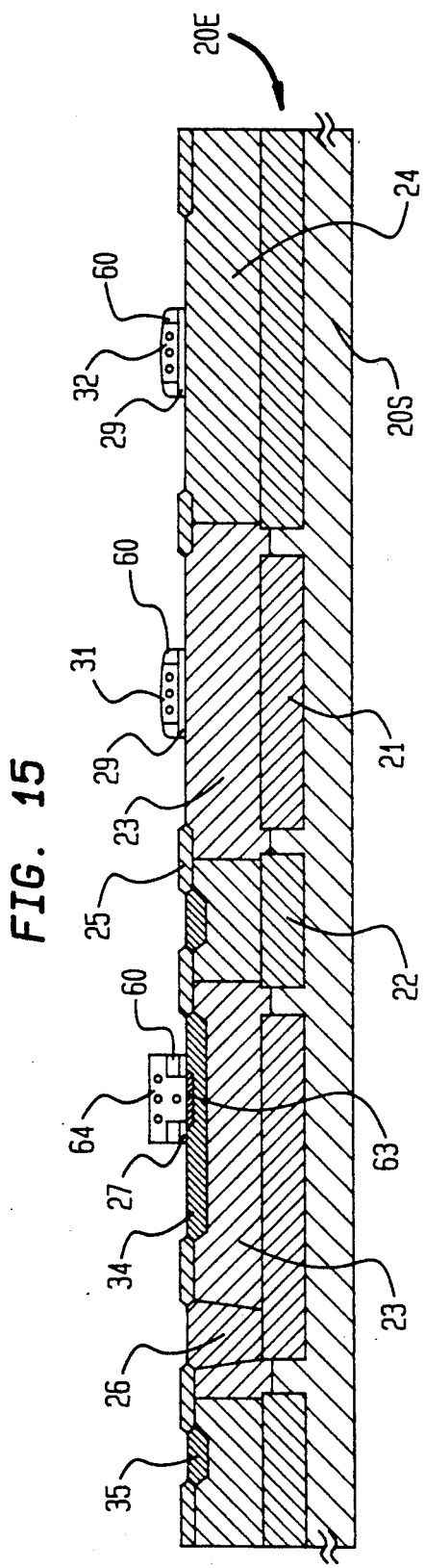

With reference to FIGS. 13 to 15, a method of manufacturing the Bi-CMOS of the embodiment will be described. The steps illustrated with reference to FIGS. 2 to 5 in Example 1 were repeated to obtain a wafer having a sectional configuration as shown in FIG. 5.

Then, a deposition film or SiO₂ film 60 having a thickness of 250 nm was deposited on the entire surface of the wafer by using the LPCVD technique. After a photoresist 61 having a pattern for the emitter diffusion window 62 was formed on the SiO₂ film 60, the SiO₂ films 60 and 27 were etched using the photoresist 61 as a mask to form the emitter diffusion window 62 (FIG. 13).

In order to remove a thin native oxide film on the surface of the P-base region 34 exposed in the emitter diffusion window 62, the wafer was immersed in a suitable HF etchant for a predetermined period of time.

A second poly-Si film serving as the emitter electrode 64 of the bipolar transistor VBT was deposited on the wafer, and then doped with As by the ion implantation technique. Thereafter, the wafer was heat treated to form an N+-emitter diffusion region 63 in the P-base region 34. A photoresist (not shown) having a pattern defining the emitter electrode 64 was formed on the second poly-Si film. Subsequently, by etching the second poly-Si film with using the photoresist as a mask, the emitter electrode 64 was formed over a region including the region in which the emitter diffusion window 62 was formed, and wider than the emitter diffusion window 62 (FIG. 14).

The SiO₂ films 60 and 29 were sequentially etched away by using the anisotropic etching technique to expose the surface of the epitaxial layer 20E (FIG. 15). Larger portions of the SiO₂ films 60 and 29 were removed by the anisotropic etching, but the portions of the SiO₂ film 60 on the sides of the gate electrodes 31 and 32 remained to form the sidewall spacers (of 250 nm in width). Under the side portions of the emitter electrode 64, the SiO₂ film (of 100 nm thick) 60 remained.

Thereafter, the steps illustrated with reference to FIGS. 10 and 11 were repeated to obtain the Bi-CMOS of the emobodiment.

In the embodiment, as shown in FIGS. 13 and 14, each MOS transistor region was covered with the deposition film or SiO₂ film 60 during the steps of forming the emitter diffusion window 62, depositing the second poly-Si film, and forming the emitter electrode 64.

Therefore, the MOS transistor regions were not contaminated with P-type inpurities from the P-base diffusion region 34 exposed in the emitter diffusion window 62.

Since the gate oxide film 29 was covered with the deposition film or SiO$_2$ film 60, the gate oxide film 29 was not etched when the native oxide present on the P-base region 34 exposed through the emitter diffusion window 62 was removed by etching. Therefore, any decrease in the thickness of the gate oxide film 29 and the formation of pin holes in the gate oxide film 29 were prevented from occurring, resulting in the desired transistor characteristics of the Bi-CMOS were obtained. Furthermore, the dielectric strength between the emitter electrode 64 and the P-base region 34 did not degrade so that there was no leakage current flowing between the emitter electrode 64 and the P-base region 34.

According to the emobodiment, the thickness of the sidewall spacers for the gate electrodes 31 and 32 can be freely selected by adjusting the thickness of the deposition film 60, thereby simplifying the overall manufacturing process.

Example 3

Figure 16A:
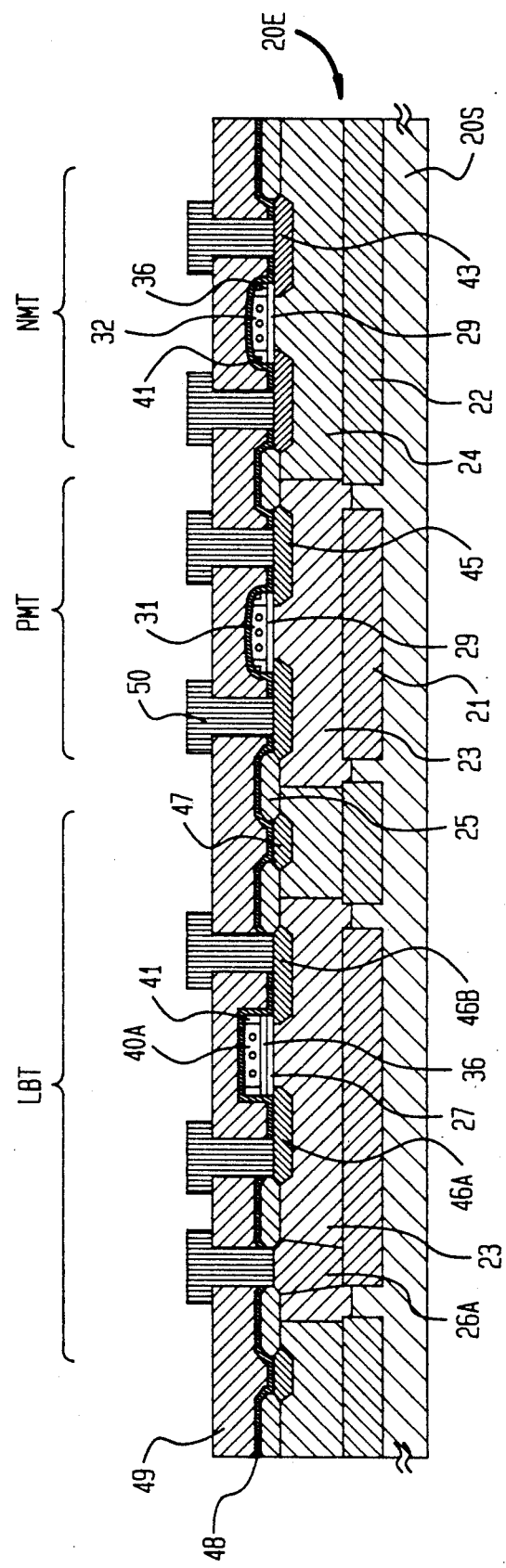
FIG. 16A is a partial sectional view of a further Bi-CMOS according to the invention.
Figure 16B:
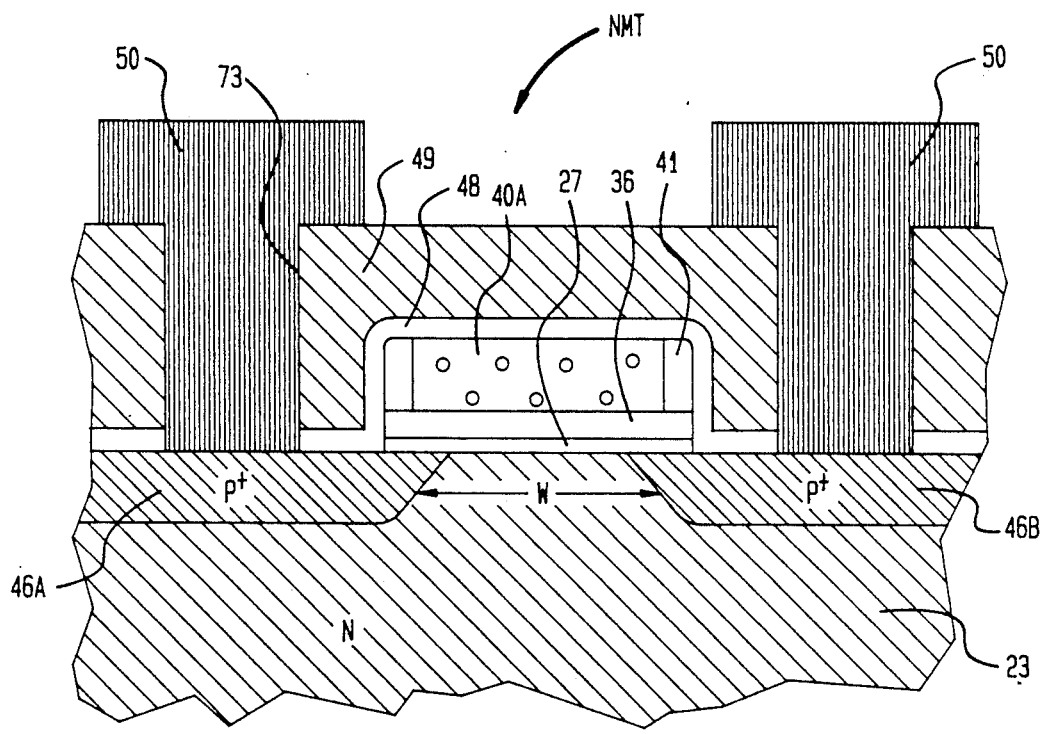
FIG. 16B shows a lateral bipolar transistor formed in the Bi-CMOS of FIG. 16A.

FIG. 16A shows a further Bi-CMOS according to the invention. The Bi-CMOS of FIG. 16A is similar in structure to that of FIG. 1A, but has a lateral PNP bipolar transistor LBT instead of the vertical NPN bipolar transistor VBT. FIG. 16B shows the lateral PNP bipolar transistor LBT. In the lateral PNP bipolar transistor LBT, a base width defining portion 40A for defining the base width W (FIG. 16B) is provided on an N-type well 23 which functions as a base. Furthermore, under the base width defining portion 40A, there are formed an oxide film 27 and a first deposition film 36 in that order from the substrate side, and sidewall spacers consisting of a second deposition film 41 are formed at the sides of the base width defining portion 40A. The MOS transistors PMT and NMT have a similar structure as those shown in FIG. 1A, and on sides of the gate electrodes 31 and 32 of the MOS transistors there is formed a sidewall spacer consisting of first and second deposition films 36 and 41.

A method of manufacturing the Bi-CMOS of FIG. 16A will be described with reference to FIGS. 17 to 26. First, the N-type epitaxial layer 20E was formed on the single crystal silicon substrate 20S with the N+-buried region 21 and P+-buried region 22 previously formed on the surface. P-type or N-type impurities were diffused into selected regions within the epitaxial layer 20E, thereby forming the P-well 24 or the N-well 23 in the epitaxial layer 20E. The field oxide film 25 was formed in regions other than the active regions by using the LOCOS technique. Thereafter, the Si$_3$N$_4$ film (not shown) used in the LOCOS process was removed. In this removal process, the SiO$_2$ film 27 formed under the Si$_3$N$_4$ film was not removed. Subsequently, the N+-base region 26A for the lateral PNP bipolar transistor LBT was formed (FIG. 17).

A photoresist 28 having a pattern convering regions other than the MOS transistor regions was formed over the filed oxide film 25 and SiO$_2$ film 27 on the epitaxial layer 20E, and then the SiO$_2$ film 27 in the MOS transistor regions not covered by the photoresist 28 was removed to expose the surface of the MOS transistor regions of the epitaxial layer 20E (FIG. 18).

Figure 19:
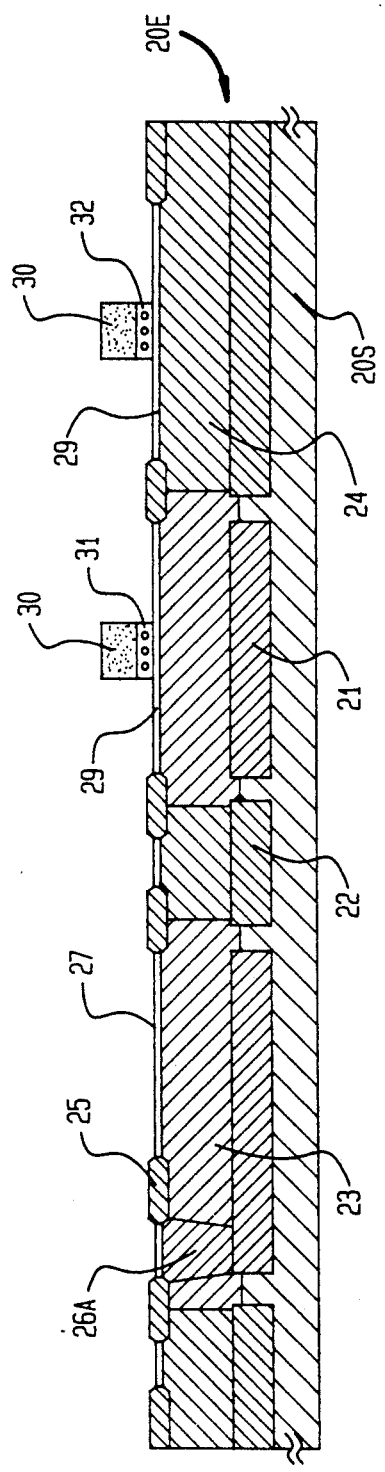

After the removal of the photoresist 28, the surface of the epitaxial layer 20E in the MOS transistor regions was subjected to oxidization, whereby the gate oxide film 29 was formed on the surface of the epitaxial layer in the MOS transistor regions. In succession to the oxidizing process, a non-doped first poly-Si film was deposited on the wafer. Then, the first poly-Si film was doped with impurities to lower its resistance. Alternatively, a doped poly-Si film containing impurities may be deposited on the wafer to obtain the low-resistance first poly-Si film. A photoresist 30 having a pattern which defines the patterns of the gate electrodes 31 and 32 was formed on the first poly-Si film, and the first poly-Si film was etched by using the photoresist 30 as a mask to form the gate electrodes 31 and 32 (FIG. 19).

Figure 20:
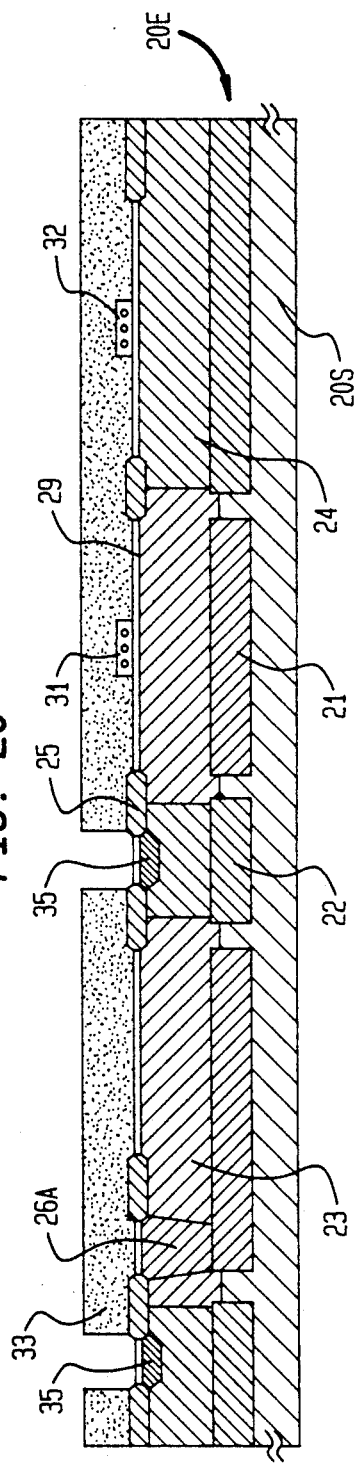

A photoresist 33 was formed, and patterned as shown in FIG. 20. Using this patterned photoresist 33 as a mask, boron was doped in the isolation region for isolating the bipolar transistor LBT from another element (not shown) by the ion implantation technique. Thus, the P+-type diffusion regions 35 were formed (FIG. 20).

Then, SiO$_2$ film 36 (thickness: 100 nm), which is the first deposition film, was formed over the wafer by the LPCVD technique (FIG. 21).

A second poly-Si film serving as the base width defining portion 40A of the bipolar transistor LBT was deposited on the wafer. A photoresist (not shown) having a pattern defining the base width was formed on the second poly-Si film. Subsequently, by etching the second poly-Si film by using the photoresist as a mask, the base width defining portion 40A was formed (FIG. 22).

Figure 23:
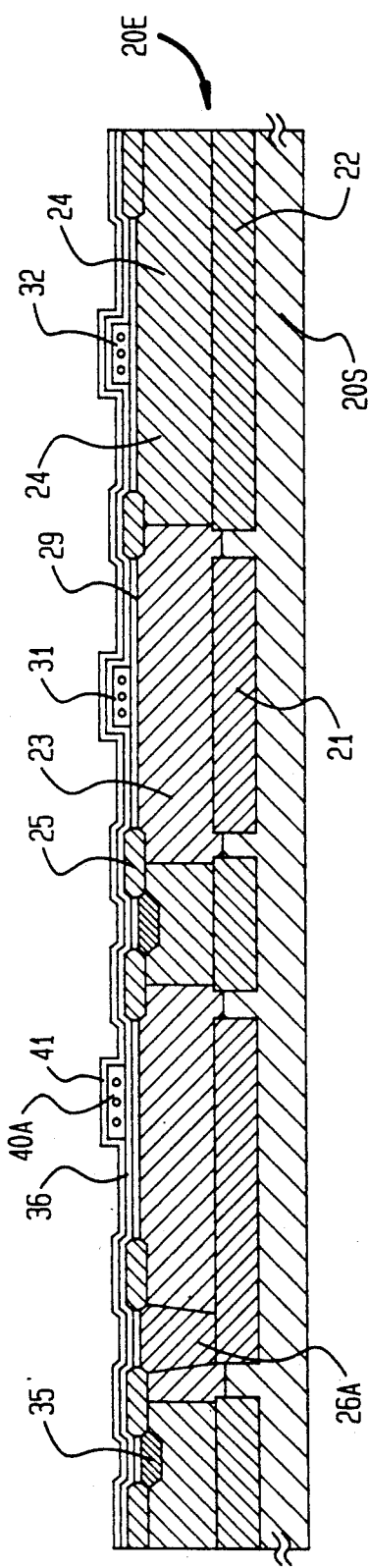

Then, the second deposition film or SiO$_2$ film 41 (of 150 nm in thickness) was deposited over the entire surface of the wafer (FIG. 23).

Figure 24:
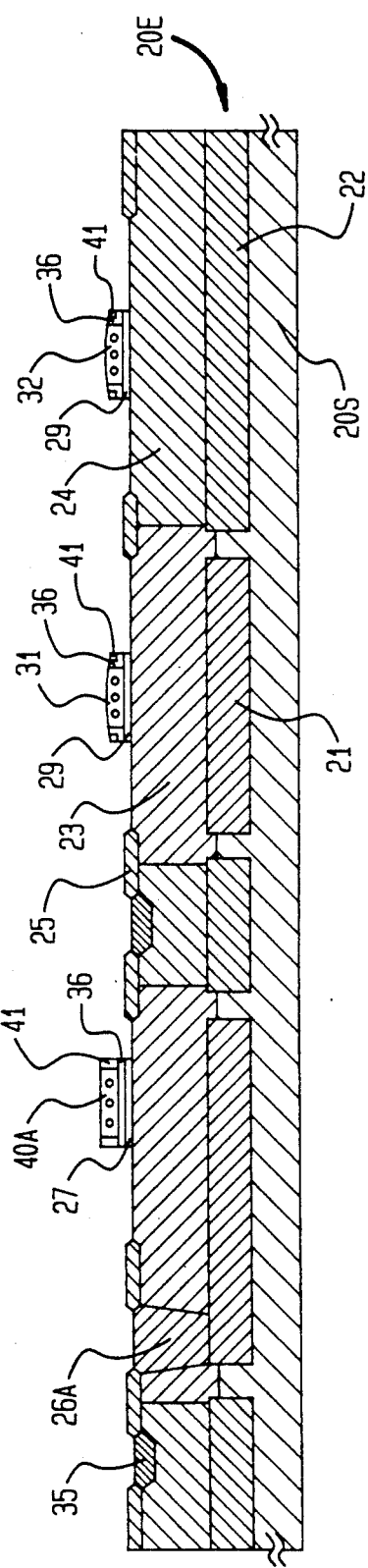

The SiO$_2$ films 41, 36 and 29 were sequentially etched away by using the anisotropic etching technique to expose the surface of the epitaxial layer 20E (FIG. 24). In this etching process, it was required to expose the surface of the epitaxial layer 20E in the source and drain regions of the MOS transistors PMT and NMT, but it was not required to completely remove the SiO$_2$ films on the epitaxial surface 20E in the bipolar transistor region. Larger portions of the SiO$_2$ films 41, 36 and 29 were removed by anisotropic etching, but the portions of the SiO$_2$ films 41 and 36 on the sides of the gate electrodes 31 and 32 remained to form the sidewall spacers 80 (of 250 nm in width). Under the side portions of the base width defining portion 40A there remained the SiO$_2$ film (of 100 nm thick) 36, and at sides of the base width defining portion 40A there was formed sidewall spacers (of 150 nm thick) consisting of the SiO$_2$ film 41.

Figure 25:
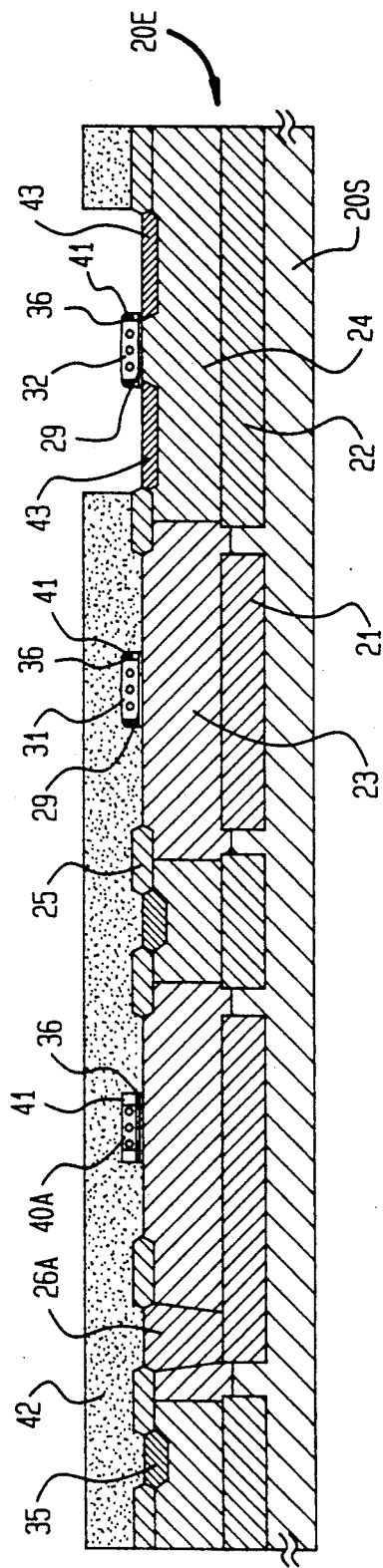

As shown in FIG. 25, then, a photoresist 42 was formed to cover the regions where the N-channel MOS transistor NMT was not to be formed. Using the photoresist 42 and gate electrode 32 as masks, As was implanted into the specified regions in the P-well 24 by the ion implantation technique. In this way, the N+-diffusion regions 43 which serve respectively as the source and the drain of the N-channel MOS transistor NMT were formed in the self-aligned relation with respect to the gate electrode 32 which has the sidewall spacers 80 on its sides. Immediately after the ion implantation process, the distance between the N+-diffusion region 43 as the source and the one as the drain was greater by the thicknesses of the sidewall spacers than the width of the gate electrode 32, because of the presence of the sidewall spacers 80. Therefore, even when the N+-diffusion regions 43 were expanded laterally as a result of the heat treatment or annealing described later, the N+-diffusion regions 43 were prevented from intruding into the region of the P-well 24 which is immediately under the gate electrode 32, with the result of little or no degradation of the transistor characteristics of the resulting N-channel MOS transistor NMT.

Figure 26:
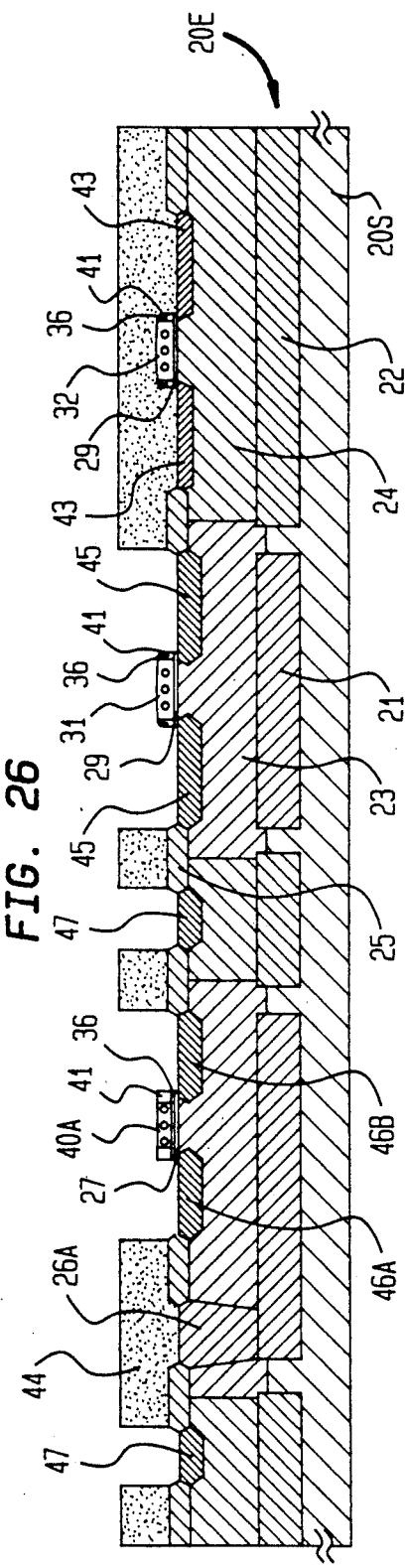
Figure 27:
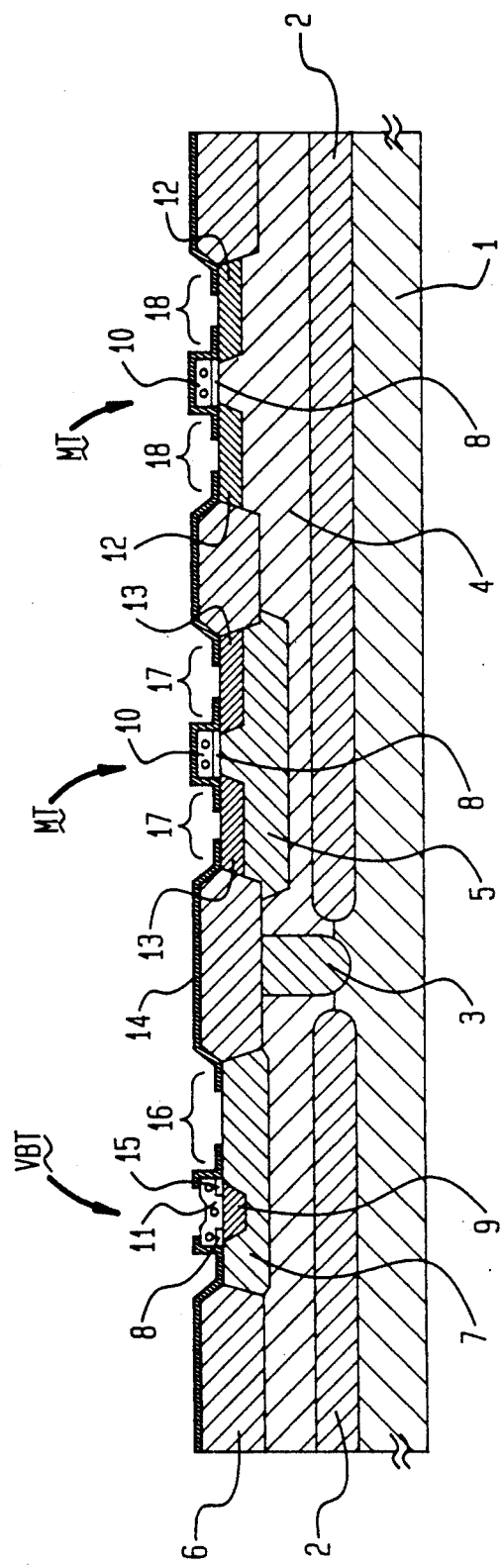
FIG. 27 is a partial sectional view of a prior art Bi-CMOS.

As shown in FIG. 26, then, a photoresist 44 was formed to cover the specified regions of the wafer. Using the photoresist 44, gate electrode 31 and base width defining portion 40A as masks, boron was implanted into the N-well 23 and P+-diffusion regions 35 by the ion implantation technique, thereby forming the P+-diffusion regions 45, P+-emitter diffusion region 46A and P+-collector diffusion region 46B, and making the concentration of the P+-diffusion regions 35 higher for the isolation of elements. The P+-diffusion regions 45 which serve respectively as the source and the drain of the P-channel MOS transistor PMT were formed in the self-aligned relationship with respect to the gate electrode 31 which has the sidewall spacers 80 on its sides. In the same manner as described above, immediately after the ion implantation process, the distance between the P+-diffusion region 45 as the source and the one as the drain was greater by the thicknesses of the sidewall spacers than the width of the gate electrode 31, because of the presence of the sidewall spacers 80. Therefore, even when the P+-diffusion regions 45 were expanded laterally as a result of the heat treatment or annealing described below, the P+-diffusion regions 45 were prevented from intruding into the region of the N-well 23, which is immediately under the gate electrode 31, with the result of little or no deterioration of the transistor characteristics of the P-channel MOS transistor PMT. As mentioned above, boron was implanted in the bipolar transistor region, and the P+-emitter diffusion region 46A and P+-collector diffusion region 46B were formed in specified regions within the N-well 23, in a self-aligned relationship with respect to the base width defining portion 40A.

Thereafter, the $Si_3N_4$ film 48 and the BPSG film 49 were deposited on the wafer, and then the wafer was annealed, whereby smoothing the surface of the BPSG film 49. As a result of this heat treatment, the P+-diffusion regions 45, and P+-emitter diffusion region 46A and P+-collector diffusion region 46B expanded laterally to intrude somewhat under the sidewall spacers 80 for the gate electrodes 31 and 32 (i.e., the $SiO_2$ films 36 and 41) and sidewall spacers ($SiO_2$ film) 41 for the base width defining portion 40A, as shown in FIG. 16B. The contact windows 70, 71, 72 and 73 were opened in the $Si_3N_4$ film 48 and BPSG film 49, and the metal wiring layer 50 was formed on the BPSG film 49. In this way, the Bi-CMOS of FIG. 16A was obtained.

According to the above-described method, the sidewall spacers 80 consisting of the first and second deposited ($SiO_2$) films 36 and 41 were formed on the sides of the gate electrodes 31 and 32 of the MOS transistors. Furthermore, the first deposition film 36 was formed under the base width defining portion 40A of the lateral bipolar transistor, and the sidewall spacers consisting of the second deposition film 41 were formed on the sides of the base width defining portion 40A. The necessary insulation between the base width emitter electrode 40 and the epitaxial layer 20E can be achieved arbitrarily by adjusting the thickness of the first deposition film 36. Furthermore, the thickness of the sidewall spacers for the gate electrode 31 and 32 can be freely determined by adjusting the thickness of the first and second deposition films 36 and 41.

In the above described method of manufacturing a Bi-CMOS, the formation of the lateral PNP bipolar transistor LBT was simultaneous with that of the P-channel MOS transistor PMT. According to the invention, therefore, the number of steps of manufacturing a Bi-CMOS can be reduced.

The lateral PNP bipolar transistor LBT in this embodiment is constructed so that the emitter diffusion region 46A and the collector diffusion region 46B are arranged in parallel. The lateral bipolar transistor can be constructed in another fashion, for example, the collector diffusion region 46B is formed in a ring shape to surround the emitter diffusion region 46A having a disk shape. In this alternative embodiment, the base width defining portion 40A is constructed so as to have a ring shaped pattern.

If a reverse high voltage is applied to the junction between the collector and the base in the lateral bipolar transistor LBT and the the junction is destroyed, carriers such as electrons may be injected from the junction into the base width defining portion 40A. In this case, the potential of the base width defining portion 40A is varied, and accordingly a kind of MOS operation occurs so that a channel is formed between the emitter and the collector. This causes a problem in that a leakage current is likely to flow between the emitter and the collector. In order to eliminate this problem, it is preferable to electrically connect the base width defining portion 40A with the emitter diffusion region 46A. Through this electrical connection, the carriers injected into the base width defining portion 40A can be discharged into the emitter diffusion region 46A.

Because of the presence of the first and second deposition films 36 and 41 in the lateral bipolar transistor LBT of the embodiment, however, the distances between the base width defining portion 40A and the emitter and collector diffusion regions 46A and 46B, and also the distance between the emitter and collector diffusion regions 46A and 46B are relatively long, resulting in a reduced electric field strength at the junction between the collector diffusion region 46B and the base (N-well 23). The reduced field strength inhibits the generation of carriers such as electrons. According to the invention, thus, a transistor device having a bipolar transistor in which the level of a leakage current at the junction is very low can be obtained.

When the first deposition film 36 is sufficiently thick or the vertical distance between the base width defining portion 40A and the collector diffusion region 46B is sufficiently long, the reduced electric field strength at the junction between the collector diffusion region 46B and the base (N-well 23) can be obtained. In such a case, therefore, it is not necessary to form the second deposition film 41.

In the above-described embodiments, the gate electrode, emitter electrode, and base width defining portion are made of poly-Si, but these elements may be made of other materials such as refractory metals (e. g., tungsten) and amorphous Si. Furthermore, these elements are structured by one film of poly-Si, but may have other structures such as a polyside structure having a lower film of poly-Si and an upper film of refractory silicide.

. The Bi-CMOSs of the above-described embodiments has a structure in which a P-substrate, N-epitaxial layer and twin (P and N) well are formed. According to the invention, however, the semicinductor device may has another structure such as those in which a P-substrate, P-epitaxial layer and twin well; and P-substrate, N-epitaxial layer and P-well; or P-substrate and N-well without an epitaxial layer.

For the thickness of deposition films, it is of course possible to use values other than those employed in the foregoing embodiments.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of manufacturing a semiconductor device comprising at least one vertical bipolar transistor and at least one MOS transistor, said bipolar and MOS transistors being formed on one semiconductor substrate, comprising the steps of:
    forming a gate oxide film at least in the MOS transistor region on the main surface of said semiconductor substrate;
    forming a gate electrode of said MOS transistor on said gate oxide film, said gate electrode being made of a first conductive thin film;
    forming a deposition film on said semiconductor substrate;
    etching said deposition film at least in the bipolar transistor region to form an emitter diffusion window; and
    forming an emitter electrode of said bipolar transistor over said emitter diffusion window, said emitter electrode being made of a second conductive thin film and being larger in size than said emitter diffusion window.

2. A method of manufacturing a semiconductor device comprising at least one vertical bipolar transistor and at least one MOS transistor, said bipolar and MOS transistors being formed on one semiconductor substrate, comprising the steps of:
    forming a gate oxide film at least in the MOS transistor region on the main surface of said semiconductor substrate;
    forming a gate electrode of said MOS transistor on said gate oxide film, said gate electrode being made of a first conductive thin film;
    forming a deposition film on said semiconductor substrate;
    etching said deposition film at least in the biplar transistor region to form an emitter diffusion window;
    forming an emitter electrode of said bipolar transistor over said emitter diffusion window, said emitter electrode being made of a second conductive thin film and being larger in size than said emitter diffusion window; and
    etching further said deposition film by using the anisotropic dry etching technique, to form sidewall spacers on the sides of said gate electrode, said sidewall spacers being made of said deposition film, and to leave said deposition film under said emitter electrode.

3. A method according to claim 2, wherein said method further comprises a step of forming source and drain diffusion regions of said MOS transistor and also an external base diffusion region of said vertical bipolar transistor, after the step of etching further said deposition film by using an anisotropic dry etching technique.

4. A method of manufacturing a semiconductor device comprising at least one vertical bipolar transistor and at least one MOS transistor, said bipolar and MOS transistors being formed on one semiconductor substrate, comprising the steps of:
    forming a gate oxide film at least in the MOS transistor region on the main surface of said semiconductor substrate;
    forming a gate electrode of said MOS transistor on said gate oxide film, said gate electrode being made of a first conductive thin film;
    forming a first deposition film on said semiconductor substrate;
    etching said first deposition film at least in the bipolar transistor region to form an emitter diffusion window;
    forming an emitter electrode of said bipolar transistor over said emitter diffusion window, said emitter electrode being made of a second conductive thin film and being larger in size than said emitter diffusion window; and
    forming a second deposition film on said semiconductor substrate;
    etching further said first and second deposition films by using the anisotropic dry etching technique, to form first sidewall spacers on the sides of said gate electrode, said first sidewall spacers being made of said first and second deposition films, to leave said first deposition film under said emitter electrode, and to form second sidewall spacers on the sides of said emitter electrode, said second sidewall spacers being made of said second deposition film.

5. A method according to claim 4, wherein said method further comprises a step of forming source and drain diffusion regions of said MOS transistor and also an external base diffusion region of said vertical bipolar transistor, after the step of etching further said first and second deposition films by using an anisotropic dry etching technique.

6. A method of manufacturing a semiconductor device comprising at least one lateral bipolar transistor and at least one MOS transistor, said bipolar and MOS transistors being formed on one semiconductor substrate, comprising the steps of:
    forming a gate oxide film at least in the MOS transistor region on the main surface of said semiconductor substrate;
    forming a gate electrode of said MOS transistor on said gate oxide film, said gate electrode being made of a first conductive thin film;
    forming a deposition film on said semiconductor substrate; and
    forming a base width defining means for defining the base width of said bipolar transistor, said base width defining means being made of a second conductive thin film.

7. A method of manufacturing a semiconductor device comprising at least one lateral bipolar transistor and at least one MOS transistor, said bipolar and MOS transistors being formed on one semiconductor substrate, comprising the steps of:

forming a gate oxide film at least in the MOS transistor region on the main surface of said semiconductor substrate;

forming a gate electrode of said MOS transistor on said gate oxide film, said gate electrode being made of a first conductive thin film;

forming a deposition film on said semiconductor substrate;

forming a base width defining means for defining the base width of said bipolar transistor, said base width defining means being made of a second conductive thin film; and etching said deposition film by using an anisotropic dry etching technique, to form sidewall spacers on the sides of said gate electrode, said sidewall spacers being made of said deposition film, and to leave said deposition film under said emitter electrode.

8. A method according to claim 7, wherein said method further comprises a step of forming source and drain diffusion regions of said MOS transistor and also an emitter and collector diffusion regions of said lateral bipolar transistor, after the step of etching said deposition film.

9. A method of manufacturing a semiconductor device comprising at least one lateral bipolar transistor and at least one MOS transistor, said bipolar and MOS transistors being formed on one semiconductor substrate, comprising the steps of:

forming a gate oxide film at least in the MOS transistor region on the main surface of said semiconductor substrate;

forming a gate electrode of said MOS transistor on said gate oxide film, said gate electrode being made of a first conductive thin film;

forming a first deposition film on said semiconductor substrate;

forming a base width defining means for defining the base width of said bipolar transistor, said base width defining means being made of a second conductive thin film; and forming a second deposition film on said semiconductor substrate;

etching said first and second deposition films by using the anisotropic dry etching technique, to form first sidewall spacers on the sides of said gate electrode, said first sidewall spacers being made of said first and second deposition films, to leave said first deposition film under said base width defining means, and to form second sidewall spacers on the sides of said base width defining means, said second sidewall spacers being made of said second deposition film.

10. A method according to claim 9, wherein said method further comprises a step of forming source and drain diffusion regions of said MOS tansistor and also an emitter and collector diffusion regions of said lateral bipolar transistor, after the step of etching said first and second deposition films.

* * * * *

UNITED STATES PATENT AND TRADEMARK OFFICE
CERTIFICATE OF CORRECTION

PATENT NO. : 5,045,493
DATED : September 3, 1991
INVENTOR(S) : Shuichi Kameyama, et al It is certified that error appears in the above—identified patent and that said Letters Patent is hereby corrected as shown below:

On title page item [73] Assignee: should read: Matsushita Electric Industrial Co., Ltd.

Claim 2, Col. 17, line 56, delete "biplar" and insert therefor --bipolar--,

Signed and Sealed this

Sixteenth Day of February, 1993

Attest:

STEPHEN G. KUNIN

Attesting Officer

Acting Commissioner of Patents and Trademarks